(12) United States Patent
Lee

(10) Patent No.: US 11,424,308 B2
(45) Date of Patent: Aug. 23, 2022

(54) DISPLAY DEVICE AND METHOD OF MANUFACTURING THE SAME

(71) Applicant: Samsung Display Co., Ltd., Yongin-si (KR)

(72) Inventor: Won Jun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 664 days.

(21) Appl. No.: 16/261,385

(22) Filed: Jan. 29, 2019

(65) Prior Publication Data

US 2020/0013841 A1 Jan. 9, 2020

(30) Foreign Application Priority Data

Jul. 3, 2018 (KR) .......... 10-2018-0077092

(51) Int. Cl.
*H01L 27/32* (2006.01)
*H01L 51/56* (2006.01)

(52) U.S. Cl.
CPC .......... *H01L 27/3276* (2013.01); *H01L 51/56* (2013.01); *H01L 2227/323* (2013.01); *H01L 2251/5392* (2013.01)

(58) Field of Classification Search
None
See application file for complete search history.

(56) References Cited

U.S. PATENT DOCUMENTS 9,305,496 B2 4/2016 Kimura
9,477,125 B2 * 10/2016 Jung .................... G09G 3/3607
2005/0140285 A1 * 6/2005 Park .................... H01L 51/5259
313/506

* cited by examiner

*Primary Examiner* — Michelle Mandala
(74) *Attorney, Agent, or Firm* — Lewis Roca Rothgerber Christie LLP

(57) ABSTRACT

A display device includes: first pixels which include a first pixel branch line extending in a first direction at one side portion and a first common branch line extending in the first direction at the other side portion which is opposite to the one side portion; second pixels which include a second common branch line extending in the first direction at the one side portion and a second pixel branch line extending in the first direction at the other side portion which is opposite to the one side portion; a first luminous element between the first pixel branch line and the first common branch line; and a second luminous element between the second common branch line and the second pixel branch line, wherein the first pixel and the second pixel are disposed in a second direction which intersects the first direction.

20 Claims, 14 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2018-0077092, filed on Jul. 3, 2018 in the Korean Intellectual Property Office, the entire content of which is incorporated herein by reference.

BACKGROUND

1. Field

Embodiments of the present disclosure relate to a display device and a method of manufacturing the same.

2. Description of the Related Art

With the development of multimedia, the importance of display devices has increased. Accordingly, various types (or kinds) of display devices such as an organic light emitting display (OLED) and a liquid crystal display (LCD) have been used.

Devices configured to display an image in display devices include display panels such as an OLED panel and an LCD panel. The display panels may include a luminous element as a light emitting display panel. Examples of a light emitting diode (LED) include an OLED which uses an organic material as a light emitting material (e.g., a fluorescent material) and an inorganic LED which uses an inorganic material as a light emitting material (e.g., a fluorescent material).

The OLED uses an organic material as the light emitting material (e.g., the fluorescent material) of a luminous element and has features such that a manufacturing process is simple and a display element may have a characteristic of being flexible. However, it is has been found that such organic materials are vulnerable to a high-temperature operation environment and have relatively low efficiency in terms of blue light.

On the other hand, the inorganic LED uses an inorganic semiconductor as the light emitting material (e.g., the fluorescent material) and has features such that the inorganic LED is durable even in a high-temperature environment and has high efficiency in terms of blue light, in comparison to the OLED. Also, even in terms of a manufacturing process which has been pointed out as a limitation of certain inorganic LED elements, a transfer method using dielectrophoresis (DEP) has been developed. Accordingly, research on an inorganic LED having high durability and efficiency, in comparison to an OLED, has been carried out.

SUMMARY

Aspects of embodiments of the present disclosure arrange alignment signal lines of a symmetrical structure (e.g., a substantially symmetrical structure) in an alignment region of a luminous element for each pixel. The alignment signal lines of the symmetrical structure are arranged to prevent or reduce the drop of an alignment voltage by reducing (e.g., removing) capacitance that may be formed between alignment signal lines of adjacent pixels when power is applied.

Aspects of embodiments of the present disclosure minimize or reduce the drop of an alignment voltage and uniformly (e.g., substantially uniformly) align luminous elements in a display device.

According to an exemplary embodiment of the disclosure, a display device comprising: first type pixels which include a first pixel branch line disposed to extend in a first direction at one side portion and a first common branch line disposed to extend in the first direction at the other side portion which is disposed opposite to the one side portion; second type pixels which include a second common branch line disposed to extend in the first direction at the one side portion and a second pixel branch line disposed to extend in the first direction at the other side portion which is disposed opposite to the one side portion; a first luminous element disposed between the first pixel branch line and the first common branch line; and a second luminous element disposed between the second common branch line and the second pixel branch line, wherein the first type pixel and the second type pixel are disposed in a second direction which intersects the first direction.

In an exemplary embodiment, at least one of the first type pixels and at least one of the second type pixels are alternately disposed in the second direction.

In an exemplary embodiment, at least a portion of the first common branch line and a portion of the second common branch line are electrically coupled (e.g., electrically connected).

In an exemplary embodiment, the second common branch line is disposed to be spaced apart from the second pixel branch line in one direction of the second direction, the display device further comprising a third pixel branch line disposed to be spaced apart from the second pixel branch line in an opposite direction of the one direction of the second direction.

In an exemplary embodiment, at least a portion of the second pixel branch line and a portion of the third pixel branch line protrude in a direction in which the second pixel branch line and the third pixel branch line face each other at one end in the first direction.

In an exemplary embodiment, wherein at least one of the second type pixels includes the first luminous element.

In an exemplary embodiment, wherein at least one of the first type pixels is disposed in the first direction.

In an exemplary embodiment, the first common branch lines of the first type pixels disposed in the first direction extend in the first direction and are coupled (e.g., connected).

In an exemplary embodiment, further comprising a common trunk line disposed to extend in the second direction, wherein the first common branch lines which extend in the first direction and are coupled to (e.g., connected to) the common trunk line.

In an exemplary embodiment, the first pixel branch lines of the first type pixels disposed in the first direction are spaced apart from each other and are disposed to be aligned in the first direction.

According to another exemplary embodiment of the disclosure, a display device comprising: as a pixel array which extends in a first direction, a pixel array in which first type pixels and second type pixels are alternately arranged, wherein: each of the first type pixels and the second type pixels includes a pixel electrode, a common electrode disposed opposite to the pixel electrode, and a luminous element disposed between the pixel electrode and the common electrode; in the first type pixels, the pixel electrode is disposed at one side of the common electrode in the first direction; and in the second type pixels, the common electrode is disposed at the other side of the pixel electrode in the first direction.

In an exemplary embodiment, the pixel electrode and the common electrode of the first type pixel and the second type pixel, respectively, include a portion which extends in a second direction which intersects the first direction.

In an exemplary embodiment, further comprising a common trunk line which extends in the first direction, wherein: the common electrode of the first type pixels includes a first common branch pattern; the common electrode of the second type pixels adjacent to the first type pixels includes a second common branch pattern which is disposed opposite to the first common branch pattern and is separated therefrom; and the first common branch pattern and the second common branch pattern are coupled to (e.g., connected to) the common trunk line.

In an exemplary embodiment, an end of the first common branch pattern and an end of the second common branch pattern are coupled to (e.g., connected to) each other.

According to another exemplary embodiment of the disclosure, a method of manufacturing a display device, the method comprising: forming, on a substrate, a conductive layer which includes a first pixel line extending in a first direction, a second pixel line disposed at one side portion of the first pixel line in a second direction which intersects the first direction, and a first common line disposed at the other side portion of the first pixel line in an opposite direction of the one side portion; aligning a luminous element between the first pixel line and the first common line; and forming a separate line by patterning at least a portion of the first pixel line extending in the first direction.

In an exemplary embodiment, the conductive layer further includes a second common line of the second pixel line which is disposed at an opposite direction of a direction in which the first pixel line is disposed; and the second pixel line and the second common line are disposed to be spaced apart from each other.

In an exemplary embodiment, in the forming of the conductive layer, at least a portion of the first pixel line and a portion of the second pixel line are coupled to (e.g., connected to) each other.

In an exemplary embodiment, the forming of the separate line includes patterning an area in which the first pixel line and the second pixel line are coupled (e.g., connected) and electrically separating the first pixel line and the second pixel line.

In an exemplary embodiment, the conductive layer further includes a common trunk line extending in the second direction.

The first common line and the second common line may extend in the first direction and may be coupled to (e.g., connected to) the common trunk line.

In an exemplary embodiment, the aligning of the luminous element includes: grounding one end of the common trunk line and applying alignment power to the first pixel line and the second pixel line; and forming capacitance between the first pixel line and the first common branch line.

It should be noted that embodiments of the present disclosure are not limited to the above-described embodiments, and other embodiments of the present disclosure will be apparent to those skilled in the art from the following descriptions.

BRIEF DESCRIPTION OF THE DRAWINGS

The above and other aspects and features of embodiments of the present disclosure will become more apparent by describing in more detail exemplary embodiments thereof with reference to the attached drawings, in which.

DETAILED DESCRIPTION

The subject matter of the present disclosure will now be described more fully hereinafter with reference to the accompanying drawings, in which embodiments of the disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the present specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

Hereinafter, embodiments will be described with reference to the accompanying drawings.

Figure 1:
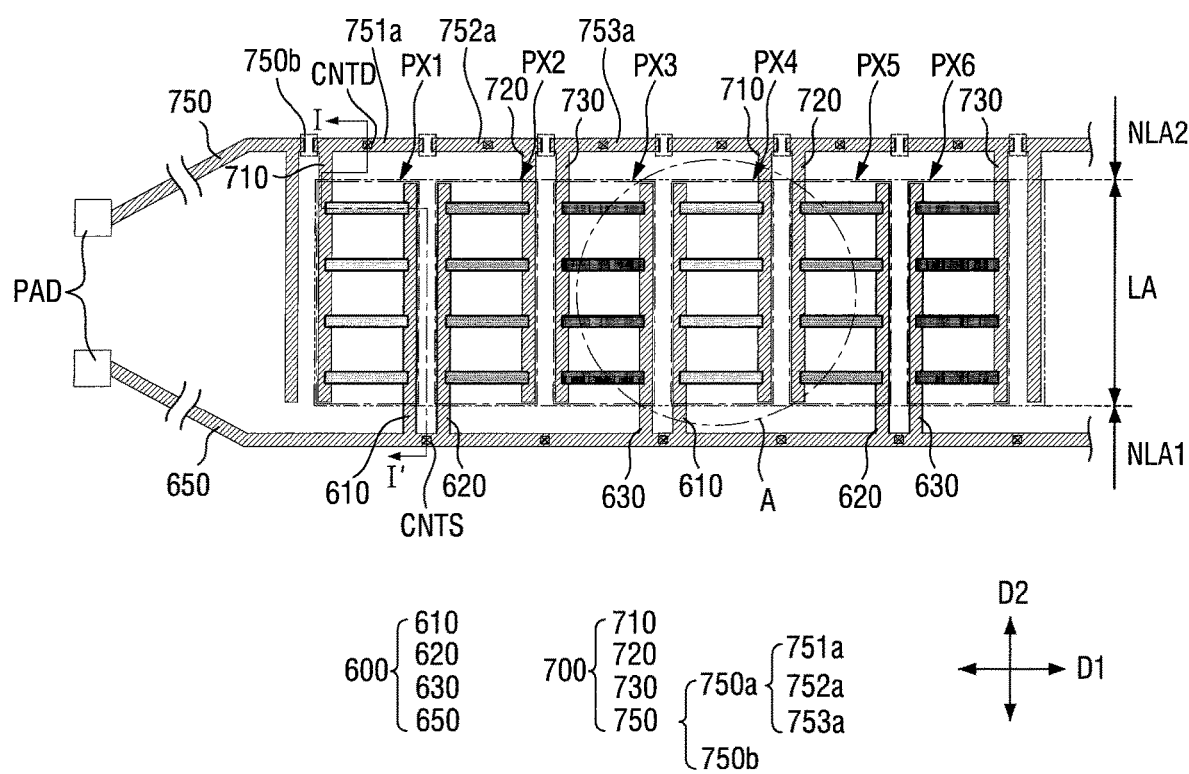
FIG. 1 is a plan view of a display device according to an embodiment.
Figure 2:
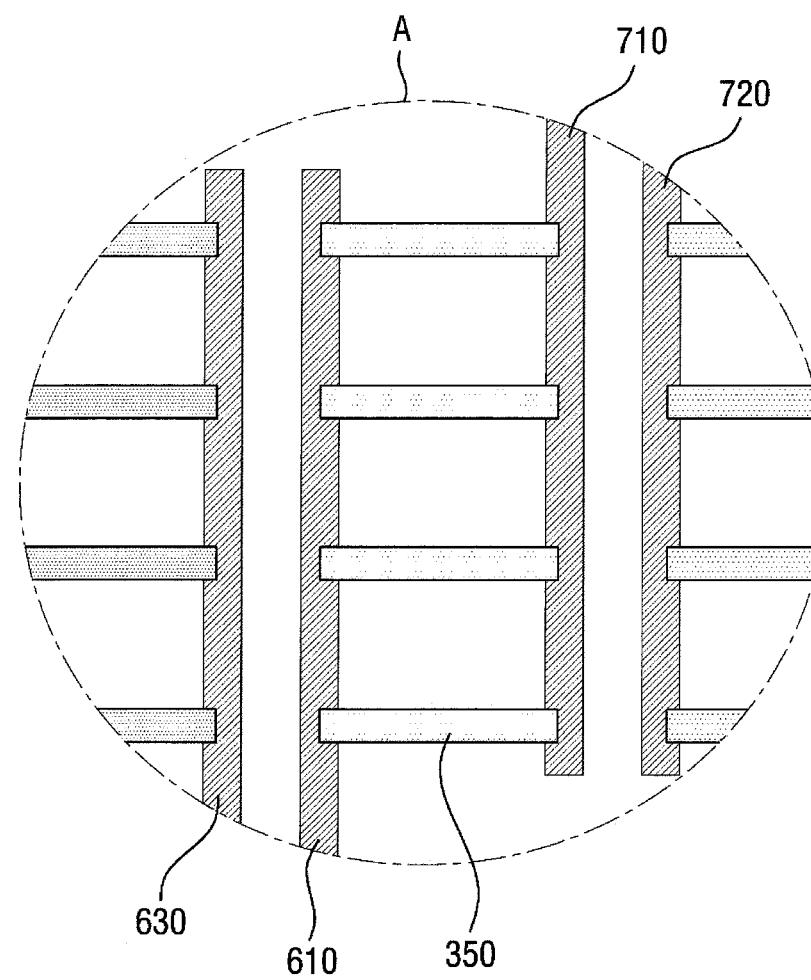
FIG. 2 is an enlarged view of a portion A of FIG. 1.

FIG. 1 is a plan view of a display device according to an embodiment. FIG. 2 is an enlarged view of a portion A of FIG. 1.

Figure 5:
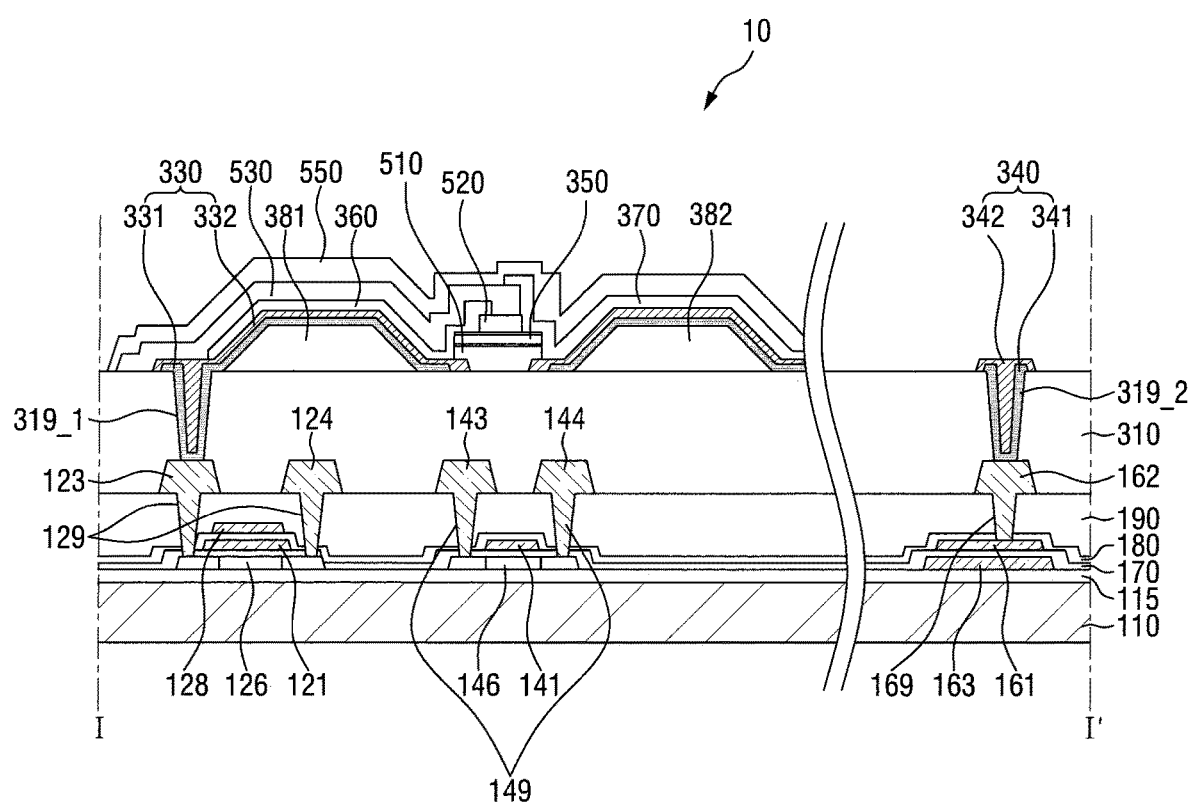
FIG. 5 is a cross-sectional view taken along line I-I' of FIG. 1.

Referring to FIGS. 1 and 5, a display device 10 may include an area defined by a luminous area LA and a non-luminous area NLA (e.g., NLA1 and NLA2). In the luminous area LA, a luminous element 350 included in the display device 10 may be disposed and configured to display light having a set or specific color. The non-luminous area NLA (e.g., a first non-luminous area NLA1 and/or a second non-luminous area NLA2) may be defined as an area other than the luminous area LA. In some embodiments, the non-luminous area NLA may be covered by set or specific members so as to be invisible (or not observable) from the outside of the display device 10. Various suitable members for operating the luminous element 350 disposed in the luminous area LA may be disposed in the non-luminous area NLA. For example, a line, a circuit, a driver, and/or the like for applying an electrical signal to the luminous area LA may be disposed in the non-luminous area NLA, but embodiments are not limited thereto.

The display device 10 includes a plurality of pixels PX (e.g., PX1, PX2, PX3, PX4, PX5, and/or PX6) disposed in the luminous area LA. Each of the plurality of pixels PX may be configured to display light in a set or specific wavelength band to the outside of the display device 10. Although six pixels PX are illustrated in FIG. 1 as an example, it is self-evident that the display device 10 may include more, or fewer, pixels. Although a plurality of pixels PX disposed in a first direction D1 are illustrated in the drawings, the plurality of pixels PX may also be disposed in an opposite direction of the first direction D1, a second direction D2, which is a direction intersecting the first direction D1, an opposite direction of the second direction D2, or the like. The pixels PX of FIG. 1 may also be divided into a plurality of pixels, and each of the pixels may form a single pixel PX. The pixels are not necessarily disposed in parallel (e.g., substantially in parallel) in the first direction D1 as illustrated in FIG. 1 and may have various suitable structures, e.g., disposed in the direction intersecting the first direction D1 (i.e., in the second direction) or disposed in a zigzag shape.

The plurality of pixels PX may include one or more luminous elements 350 (see FIG. 2) configured to emit light in a set or specific wavelength band and configured to display a color. Light emitted from the luminous element 350 may be visible from the outside through the luminous area LA of the display device 10 (see FIG. 5). In one embodiment, luminous elements 350 configured to emit different colors may be included in pixels PX configured to display different colors. For example, a first pixel PX1 and a fourth pixel PX4 configured to display red may include luminous elements 350 configured to emit red light, a second pixel PX2 and a fifth pixel PX5 configured to display green may include luminous elements 350 configured to emit green light, and a third pixel PX3 and a sixth pixel PX6 configured to display blue may include luminous elements 350 configured to emit blue light. However, embodiments are not limited thereto, and pixels configured to display different colors may also include luminous elements 350 configured to emit the same (e.g., substantially the same) colored light (e.g., blue light), and the color of each pixel may also be realized by a wavelength conversion layer or a color filter disposed on or along a luminous path of the respective light.

The display device 10 may include a plurality of lines 600 and 700, and a plurality of luminous elements 350. At least a portion of the plurality of lines 600 and 700 may be disposed in each pixel PX and electrically coupled to (e.g., electrically connected to) the luminous elements 350, and may apply an electrical signal to the luminous elements 350 so that the luminous elements 350 emit a set or specific colored light. At least a portion of the plurality of lines 600 and 700 may be utilized in forming an electric field in the pixels PX so as to align the luminous elements 350. For example, accurately aligning different luminous elements 350 for each pixel PX is useful or important when aligning the luminous elements 350, which are configured to emit different colored light, to the plurality of pixels PX. When aligning the luminous elements 350 using dielectrophoresis (DEP), a solution which contains the luminous elements 350 may be applied on the display device 10, AC power may be applied thereto to form an electric field, and a direlectrophoretic force may be applied to the luminous elements 350 to align the luminous elements 350. A method of aligning the luminous elements 350 will be described in more detail herein below.

The plurality of lines 600 and 700 may include a common line 600 and a pixel line 700. The common line 600 and the pixel line 700 may include trunk lines 650 and 750 disposed to extend in the first direction and a plurality of branch lines 610, 620, 630 and 710, 720, 730 which extend and branch off from the trunk lines 650 and 750, respectively, in the second direction intersecting the first direction.

For example, a common trunk line 650, which is a trunk line of the common line 600, may have one end that is coupled to (e.g., connected to) a signal application pad PAD and another end that is disposed in the first direction D1 and extends to another adjacent pixel PX. The signal application pad PAD may be coupled to (e.g., connected to) the display device 10 or an external power source and apply an electrical signal to the common line 600. The plurality of pixels PX which are adjacent in the first direction D1 may share the common trunk line 650 which is disposed to extend.

The plurality of common branch lines 610, 620, and 630 branch off from the common trunk line 650 and extend in the second direction D2 intersecting the first direction D1. The plurality of common branch lines 610, 620, and 630 may be terminated in a state of being spaced apart from a pixel trunk line 750 which is disposed opposite to the common trunk line 650. For example, the common branch lines 610, 620, and 630 may be disposed in a state in which one end is coupled to (e.g., connected to) the common trunk line 650 and another end is spaced apart from another trunk line. For example, the plurality of common branch lines 610, 620, and 630, e.g., a first common branch line 610, a second common branch line 620, and a third common branch line 630, may be spaced apart from the common trunk line 650, branch off therefrom, and be disposed for each pixel PX. Due to having one end coupled to (e.g., connected to) the common trunk line 650, the first common branch line 610, the second common branch line 620, and the third common branch line 630 may receive the same electrical signal for each pixel PX.

The pixel line 700 may include the pixel trunk line 750. The pixel trunk line 750 may be disposed opposite to the common trunk line 650 and may be spaced apart from the common trunk line 650.

For example, the pixel trunk line 750 may also have one end coupled to (e.g., connected to) the signal application pad PAD and another end which is disposed in the first direction D1 and extends to another adjacent pixel PX. Accordingly, the pixel trunk line 750 may receive an electrical signal from the signal application pad PAD, and a plurality of adjacent pixels PX may share the pixel trunk line 750.

The plurality of pixel branch lines 710, 720, and 730 branch off from the pixel trunk line 750 and extend in the second direction D2 intersecting the first direction D1. The pixel branch lines 710, 720, and 730 may be terminated in a state of being spaced apart from the common trunk line 650 that is disposed opposite to the pixel trunk line 750. For example, the pixel branch lines 710, 720, and 730 may be disposed in a state in which one end is coupled to (e.g., connected to) the pixel trunk line 750 and another end is spaced apart from another trunk line (e.g., the common trunk line 650).

The plurality of pixel branch lines 710, 720, and 730 may include a first pixel branch line 710, a second pixel branch line 720, and a third pixel branch line 730. For example, the first pixel branch line 710, the second pixel branch line 720, and the third pixel branch line 730 may be spaced apart from the pixel trunk line 750, branch off therefrom, and be disposed for each pixel PX configured to display a different color. As illustrated in FIG. 1, the first pixel branch line 710 may be disposed for the first pixel PX1 and the fourth pixel PX4 configured to emit red light, the second pixel branch line 720 may be disposed for the second pixel PX2 and the fifth pixel PX5 configured to emit green light, and the third pixel branch line 730 may be disposed for the third pixel PX3 and the sixth pixel PX6 configured to emit blue light. As will be further described herein below, the pixel branch lines 710, 720, and 730 disposed for each pixel PX may control emission of the luminous element 350 disposed in each pixel PX by different electrical signals being applied thereto. Accordingly, the pixel branch lines 710, 720, and 730 may adjust colors displayed by the pixels PX of the display device 10.

In some embodiments, the common line 600 may be a common electrode disposed for each pixel PX, and the pixel line 700 may be a pixel electrode. Any one of the common line 600 and the pixel line 700 may be an anode electrode, and the other one may be a cathode electrode.

The common trunk line 650 and the pixel trunk line 750 may be separated from each other with respect to the luminous area LA and may be disposed in different non-luminous areas NLA. For example, the common trunk line 650 may be disposed in the first non-luminous area NLA1 disposed at one side portion of the luminous area LA, e.g., below the luminous area LA in the drawings, and the pixel trunk line 750 may be disposed in the second non-luminous area NLA2 disposed at the other side portion of the luminous area LA, e.g., above the luminous area LA in the drawings. The other side portion of the luminous area LA may be a side portion in a direction opposite to the one side portion, but the present disclosure is not limited thereto. Also, instead of the common trunk line 650 and the pixel trunk line 750 being disposed below and above the luminous area LA, respectively, the common trunk line 650 may be disposed above the luminous area LA, and the pixel trunk line 750 may be disposed below the luminous area LA, depending upon the point of view.

By different lines disposed in the display device 10 being separately disposed in different non-luminous areas NLA with respect to the luminous area LA, a space of the non-luminous area NLA may be minimized or reduced. The plurality of lines 600 and 700 may be separately disposed so that the luminous area LA is maximized or increased for the same area.

However, embodiments are not limited thereto, and the structure in which the plurality of lines 600 and 700 are disposed is not particularly limited as long as the plurality of lines 600 and 700 are respectively disposed in a non-luminous area NLA of at least one one side portion and another side portion. In some embodiments, the plurality of lines 600 and 700 may be disposed at a right portion and a left portion, depending upon the point of view, with respect to the luminous area LA so as to be spaced apart from each other. In some embodiments, all of the different lines may also be disposed in the same (e.g., substantially the same) direction with respect to the luminous area LA.

As described above, the plurality of common branch lines 610, 620, and 630 and the plurality of pixel branch lines 710, 720, and 730 may be disposed in the pixels PX of the luminous area LA. Accordingly, at least a portion of the common line 600 and the pixel line 700 may be disposed in the non-luminous area NLA, and the remaining portion thereof may be disposed in the luminous area LA. However, embodiments are not limited thereto, and the trunk lines may also be disposed in the luminous area LA in some cases.

In a single pixel PX, the pixel branch lines 710, 720, and 730 may be disposed by forming pairs with the common branch lines 610, 620, and 630, respectively. The branch lines forming a pair are disposed opposite to each other and spaced apart from each other. For example, the first pixel branch line 710 and the first common branch line 610 may be disposed to form a pair in the first pixel PX1 and the fourth pixel PX4, the second pixel branch line 720 and the second common branch line 620 may be disposed to form a pair in the second pixel PX2 and the fifth pixel PX5, and the third pixel branch line 730 and the third common branch line 630 may be disposed to form a pair in the third pixel PX3 and the sixth pixel PX6.

Since the common branch lines 610, 620, 630 and the pixel branch lines 710, 720, 730 branch off from the common trunk line 650 and the pixel trunk line 750, respectively, structures in which the common branch lines 610, 620, 630 and the pixel branch lines 710, 720, 730 are disposed in the pixels PX may be partially different in accordance with the arrangement of trunk lines.

For example, in the case of the common trunk line 650 disposed in the first non-luminous area NLA1 which is disposed at one side portion of the luminous area LA, e.g., below the luminous area LA, the plurality of common branch lines 610, 620, and 630 may branch off and extend in the second direction D2. In some embodiments, the common branch lines 610, 620, and 630 may be disposed to extend from the bottom to the top of the drawings. The pixel trunk line 750 may be disposed opposite to the common trunk line 650 and be disposed in the second non-luminous area NLA2 which is disposed at the other side portion of the luminous area LA, e.g., above the luminous area LA. In this case, the plurality of pixel branch lines 710, 720, and 730 may branch off and extend in the opposite direction of the second direction D2. For example, the pixel branch lines 710, 720, and 730 may be disposed to extend from the top to the bottom of the drawings. In other words, the plurality of pixel branch lines 710, 720, 730 and the plurality of common branch lines 610, 620, 630 may branch off from each respective trunk line to be spaced apart from each other in the pixels PX and be disposed in directions facing (e.g., opposite) each other.

In some embodiments, the first common branch line 610 disposed in the first pixel PX1 may be disposed to extend in the second direction D2, and the first pixel branch line 710 may be disposed to extend in the opposite direction of the second direction D2 while being disposed opposite to the first common branch line 610 and spaced apart therefrom. Consequently, the first common branch line 610 and the first pixel branch line 710 may be parallel (e.g., substantially parallel) to each other while only partial areas of side surfaces thereof overlap in the same (e.g., substantially the same) plane. Ends of the first common branch line 610 and the first pixel branch line 710 may be disposed in opposite directions with respect to the center of the first pixel PX1.

The same may apply for the second common branch line 620 and the second pixel branch line 720 disposed in the second pixel PX2 and the third common branch line 630 and the third pixel branch line 730 disposed in the third pixel PX3. For example, both pairs of the second pixel branch line 720 and the second common branch line 620 and the third pixel branch line 730 and the third common branch line 630 may be parallel (e.g., substantially parallel) to each other while only partial areas of side surfaces thereof overlap in the same (e.g., substantially the same) plane, and ends thereof may be disposed in opposite directions with respect to the center of the second pixel PX2 and the center of the third pixel PX3.

However, embodiments are not limited thereto. As described above, the arrangement of the common branch lines 610, 620, 630 and the pixel branch lines 710, 720, 730 disposed in each pixel PX may be changed in various suitable ways in accordance with the arrangement of the common trunk line 650 and the pixel trunk line 750. For example, when the common trunk line 650 and the pixel trunk line 750 are disposed in the same (e.g., substantially the same) direction (e.g., in the first non-luminous area NLA1 or the second non-luminous area NLA2) with respect to the luminous area LA, branch lines which branch off from each trunk line to be disposed in the pixels PX may extend in the same (e.g., substantially the same) direction.

In other words, the first common branch line 610 disposed in the first pixel PX1 may extend in the second direction D2, and the first pixel branch line 710 may also extend in the second direction D2. The first common branch line 610 and the first pixel branch line 710 may be parallel (e.g., substantially parallel) to each other, and most of the side surfaces thereof may overlap in the same (e.g., substantially the same) plane. Ends of the first common branch line 610 and the first pixel branch line 710 may be disposed in the same (e.g., substantially the same) direction with respect to the center of the first pixel PX1.

One of the common branch lines 610, 620, or 630 and one of the pixel branch lines 710, 720, or 730 disposed opposite to each other and spaced apart from each other in a single pixel PX may respectively constitute a pixel electrode 330 and a common electrode 340 of the display device 10. The above-described luminous elements 350 may be disposed between one of the pixel branch lines 710, 720, or 730 and one of the common branch lines 610, 620, or 630 which are opposite to each other. One end of the luminous element 350 may be coupled to (e.g., connected to) one of the pixel branch lines 710, 720, or 730, and the other end of the luminous element 350 may be coupled to (e.g., connected to) one of the common branch lines 610, 620, or 630. Accordingly, the luminous element 350 may receive an electrical signal from one of the pixel branch lines 710, 720, 730 and one of the common branch lines 610, 620, or 630 and emit colored light.

Referring to FIG. 2, a plurality of luminous elements 350 may be arbitrarily disposed between respective ones of pixel branch lines 710, 720, and 730 and common branch lines 610, 620, and 630. As described above, the luminous elements 350 may come into contact with respective ones of the pixel branch lines 710, 720, and 730 and the common branch lines 610, 620, and 630 which are disposed so that the respective ends are opposite to each other and spaced apart from each other. In this case, the arrangement structure of the luminous elements 350 may be disposed substantially perpendicular to the pixel branch lines 710, 720, and 730 and the common branch lines 610, 620, and 630 and may be disposed to be substantially parallel to the corresponding portions of the pixel trunk line 750 and the common trunk line 650.

Meanwhile, as described above, the common branch lines 610, 620, and 630 and the pixel branch lines 710, 720, and 730 are spaced apart from the common trunk line 650 and the pixel trunk line 750, respectively, branch off therefrom, and are disposed opposite to each other in a single pixel PX. However, the common branch lines 610, 620, 630 and the pixel branch lines 710, 720, 730 disposed for each pixel PX may also be disposed in different structures. For example, with respect to the centers of the pixels PX, the pixel branch lines 710, 720, 730 may be disposed at one side portion, and the common branch lines 610, 620, 630 may be disposed at the other side portion. In some embodiments, the common branch lines 610, 620, 630 may be disposed at the one side portion while the pixel branch lines 710, 720, 730 are disposed at the other portion. This will be described in more detail with reference to FIGS. 3-4.

Figure 3:
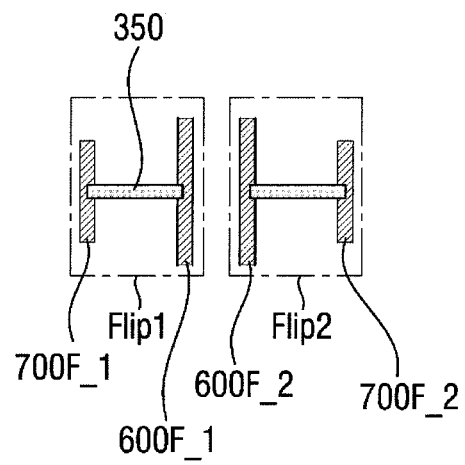
FIG. 3 is a plan view schematically illustrating type pixels according to an embodiment.
Figure 4:
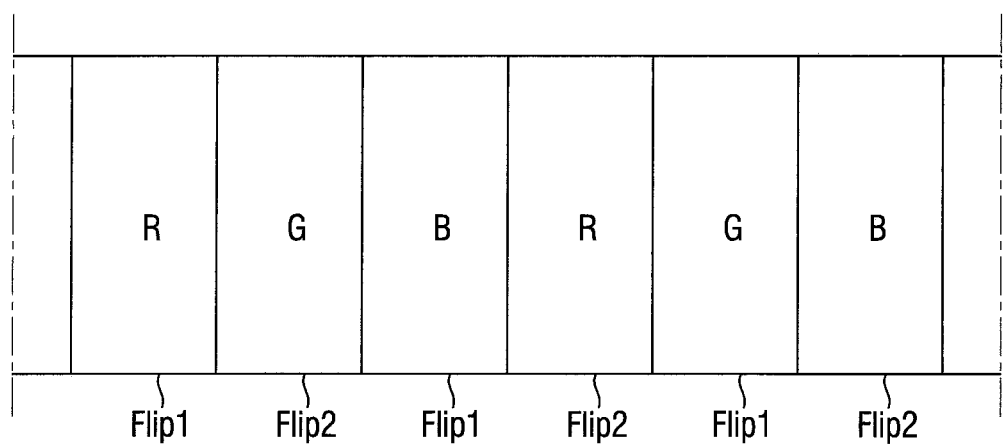
FIG. 4 is a schematic diagram illustrating the arrangement of pixels in the display device according to an embodiment.

FIG. 3 is a plan view schematically illustrating different type pixels according to an embodiment. FIG. 4 is a schematic diagram illustrating the arrangement of pixels in the display device according to an embodiment Referring to FIG. 3, a display device 10 according to an embodiment may include type pixels Flip 1 and Flip 2 having different arrangement structures. In the case of the first type pixel Flip 1, pixel branch lines 710, 720, 730 may be disposed at one side portion, e.g., a left side portion, in the first type pixel Flip 1 and constitute a first type pixel electrode 700F_1. Common branch lines 610, 620, 630 may be disposed at a side portion opposite to the one side portion, e.g., at a right side portion, of the first type pixel Flip 1 and constitute a first type common electrode 600F_1. The first type pixel electrode 700F_1 and the first type common electrode 600F_1 may be disposed opposite to each other and spaced apart from each other in the first type pixel Flip 1. Luminous elements 350 may be disposed between the first type pixel electrode 700F_1 and the first type common electrode 600F_1.

In the case of the second type pixel Flip 2, the common branch lines 610, 620, 630 may be disposed at the one side portion, e.g., the left side portion, and constitute a second type common electrode 600F_2. The pixel branch lines 710, 720, 730 may be disposed at the other side portion opposite to the one side portion, e.g., at the right side portion, and constitute a second type pixel electrode 700F_2. For example, the first type pixel Flip 1 and the second type pixel Flip 2 may have structures symmetrical (e.g., substantially symmetrical) to each other.

When the first type pixel Flip 1 and the second type pixel Flip 2 are adjacent and alternately aligned, the first type pixel electrode 700F_1 and the second type common electrode 600F_2 may be disposed at the one side portion and the other side portion, respectively, with respect to the first type common electrode 600F_1. Also, the second type common electrode 600F_1 and the first type pixel electrode 700F_1 may be disposed at the one side portion and the other side portion, respectively, with respect to the second type pixel electrode 700F_2.

In some embodiments, at least one of the type common electrodes 600F_1 and 600F_2 and at least one of the type pixel electrodes 700F_1 and 700F_2 may be disposed at both side portions adjacent to the type common electrodes 600F_1 and 600F_2 and the type pixel electrodes 700F_1 and 700F_2. In this case, as will be described below, since an electric field is not formed (or substantially not formed) in areas where the luminous elements 350 are not aligned, e.g., areas between the type pixel electrodes 700F_1, 700F_2 and the type pixel electrodes 700F_1, 700F_2 and areas between the type common electrodes 600F_1 and 600F_2 and the type common electrodes 600F_1 and 600F_2, capacitance is not generated therein (or not substantially generated therein). The drop of a voltage of AC power may be minimized or reduced by removing capacitance that may be formed in areas in which the luminous elements 350 are not aligned.

However, embodiments are not limited thereto, and only one of the type common electrodes 600F_1 and 600F_2 may be substantially disposed between the type pixel electrodes 700F_1 and 700F_2. For example, the type pixel electrodes 700F_1 and 700F_2 may be respectively disposed at both side surfaces of the type common electrode 600F_1 or 600F_2. When the first type pixel Flip 1 and the second type pixel Flip 2 are alternately aligned in an arbitrary direction, two type pixel electrodes 700F and a single type common electrode 600F may be alternately disposed.

Accordingly, different type pixel electrodes 700F_1 and 700F_2 may share a single type common electrode 600F_1 or 600F_2. The luminous elements 350 may be disposed at both side surfaces of the type common electrode 600F_1 or 600F_2 being shared. In other words, arbitrary type pixel electrodes 700F_1 and 700F_2 may be coupled to (e.g., connected to) the luminous elements 350 only in a single pixel PX. On the other hand, the type common pixels 600F_1 and 600F_2 may be coupled to (e.g., connected to) the luminous elements 350 in two or more pixels PX.

FIG. 4 schematically illustrates the arrangement of pixels PX in the display device 10 of FIG. 1. In an exemplary embodiment, the first pixel PX1 and the fourth pixel PX4 may be configured to display red (R, "flipped R"), the second pixel PX2 and the fifth pixel PX5 may be configured to display green (G, "flipped G"), and the third pixel PX3 and the sixth pixel PX6 may be configured to display blue (B, "flipped B"). FIG. 4 illustrates an arrangement structure with respect to colors that the pixels PX are configured to display. When the first pixel PX1 to the sixth pixel PX6 are disposed in the first direction D1 as illustrated in FIG. 1, the first pixel PX1 to the sixth pixel PX6 may be configured to display red (R), green (G), blue (B), red (R), green (G), and blue (B), respectively.

In the display device 10, the first type pixel Flip 1 and the second type pixel Flip 2 may be aligned in the first direction D1 of FIG. 1 while being alternately disposed. For example, when the first type pixel Flip 1 configured to display red (R) is disposed in the first pixel PX1, the second type pixel Flip 2 configured to display green (G) may be disposed in the second pixel PX2. The first type pixel Flip 1 configured to display blue (B) may be disposed in the third pixel PX3, and the second type pixel Flip 2 configured to display red (R) again may be disposed in the fourth pixel PX4.

Accordingly, the first pixel PX1 and the second pixel PX2 may have symmetrical structures (e.g., substantially symmetrical structures) in terms of the arrangement of electrodes. Even when the first pixel PX1 and the fourth pixel PX4 are configured to display the same (e.g., substantially the same) color, e.g., red (R), the first type pixel Flip 1 and the second type pixel Flip 2 which are different from each other may be disposed in the first pixel PX1 and the fourth pixel PX4, respectively. Although the case in which a single first type pixel Flip 1 is disposed in each pixel PX, e.g., the first pixel PX1 which is configured to display red (R), is illustrated as an example in FIG. 4, embodiments are not limited thereto. In some embodiments, a plurality of first type pixels Flip 1 may be disposed in the first pixel PX1 which is configured to display red (R). This will be described in more detail herein below with reference to another embodiment.

The display device 10 may have a structure in which the above-described first type pixel Flip 1 and second type pixel Flip 2 are alternately aligned in the pixels PX of the luminous area LA. Accordingly, regarding the common trunk line 650 and the pixel trunk line 750 disposed on the display device 10, gaps at which various lines are spaced apart and branch off may vary.

In one embodiment, other common branch lines 610, 620, and 630 adjacent to arbitrary common branch lines 610, 620, and 630 may be spaced apart from the common trunk line 650 at different gaps and branch off therefrom. For example, in comparison to other common branch lines 610, 620, and 630 which are spaced apart at a small gap in the first direction D1 of the arbitrary common branch lines 610, 620, and 630, still other common branch lines 610, 620, and 630 which are spaced at a small gap in the opposite direction of the first direction D1 may be spaced apart at relatively larger gaps. Also, even in the case of the pixel branch lines 710, 720, and 730, other pixel branch lines 710, 720, and 730 adjacent to arbitrary pixel branch lines 710, 720, and 730 may be spaced apart from the pixel trunk line 750 at different gaps and branch off therefrom.

For example, the first pixel PX1, the second pixel PX2, and the third pixel PX3 which are disposed to be adjacent in the first direction D1 as illustrated in FIG. 1 will be described as an example.

The second common branch line 620 branches off between the third common branch line 630 spaced apart in the first direction D1 and the first common branch line 610 spaced apart in the opposite direction of the first direction D1. The gap at which the second common branch line 620 and the first common branch line 610 are spaced apart may be shorter than the gap at which the second common branch line 620 and the third common branch line 630 are spaced apart. For example, the first common branch line 610 may branch off while being relatively more adjacent to the second common branch line 620 than to the third common branch line 630.

The second pixel branch line 720 branches off between the third pixel branch line 730 spaced apart in the first direction D1 and the first pixel branch line 710 spaced apart in the opposite direction of the first direction D1. The gap at which the second pixel branch line 720 and the third pixel branch line 730 are spaced apart may be shorter than the gap at which the second pixel branch line 720 and the first pixel branch line 710 are spaced apart. For example, the third pixel branch line 730 may branch off while being relatively more adjacent to the second pixel branch line 720 than to the first pixel branch line 710.

In other words, at least two or more of the common branch lines 610, 620, 630 and at least two or more of the pixel branch lines 710, 720, 730 of the display device 10 may form a pair, be spaced apart at a relatively small gap, and branch off. The branch lines forming a pair may branch off in parallel (e.g., substantially in parallel) to each other from each trunk line. For example, as in FIG. 1, the first common branch line 610 and the second common branch line 620 may form a pair and branch off while being adjacent to each other, and the second pixel branch line 720 and the third pixel branch line 730 may form a pair and branch off while being adjacent to each other.

As described above, the common branch lines 610, 620, 630 and the pixel branch lines 710, 720, 730 are disposed opposite to each other and spaced apart from each other in each pixel PX. In this case, the pixel branch lines 710, 720, 730 may not be disposed between the common branch lines 610, 620, 630 which are spaced apart at a relatively small gap, and the common branch lines 610, 620, 630 may be disposed between the pixel branch lines 710, 720, 730 which are spaced apart at relatively large gaps. In the opposite case as well, the common branch lines 610, 620, 630 may not be disposed between the pixel branch lines 710, 720, 730 which are spaced apart at relatively small gaps, and the common branch lines 610, 620, 630 may be disposed between the pixel branch lines 710, 720, 730 which are spaced apart at relatively large gaps.

For example, the first pixel branch line 710 and the first common branch line 610 are disposed in the first pixel PX1, the second pixel branch line 720 and the second common branch line 620 are disposed in the second pixel PX2, and the third pixel branch line 730 and the third common branch line 630 are disposed in the third pixel PX3. The pixel branch lines 710, 720, and 730 may not be disposed between the first common branch line 610 and the second common branch line 620, which are spaced apart at a relatively small gap. On the contrary, the pixel branch lines 710, 720, and 730, e.g., the second pixel branch line 720 and the third pixel branch line 730 which is spaced apart from the second pixel branch line 720 at a relatively small gap, may be disposed between the second common branch line 620 and the third common branch line 630, which are spaced apart at a relatively large gap. Also, the first common branch line 610 and the second common branch line 620 may be disposed between the first pixel branch line 710 and the second pixel branch line 720 which are spaced apart at a relatively large gap. In addition, in the case of the fourth pixel PX4 disposed in the first direction D1 of the third pixel PX3, the first pixel branch line 710 and the first common branch line 610 may be disposed by a method identical to that described above. For example, the third common branch line 630 and the first common branch line 610 may be disposed adjacent to the fourth pixel PX4, and the first pixel branch line 710 may be disposed to be spaced apart from the fourth pixel PX4. The pixels PX which may be disposed to further extend in the first direction D1 may also be disposed by the same method.

Accordingly, with respect to the boundary between the first pixel PX1 and the second pixel PX2, the branch lines disposed in each pixel PX, e.g., the first pixel branch line 710 and the first common branch line 610, and the second common branch line 620 and the second pixel branch line 720, may be disposed to be symmetrical (e.g., substantially symmetrical). With respect to the boundary between the second pixel PX2 and the third pixel PX3, the branch lines disposed in each pixel PX, e.g., the second common branch line 620 and the second pixel branch line 720, and the third pixel branch line 730 and the third common branch line 630, may be disposed to be symmetrical (e.g., substantially symmetrical). The branch lines disposed in the first pixel PX1 and the third pixel PX3 may be disposed in structures which are substantially the same.

Regarding the branch lines which are aligned in the first direction D1 from an area in which the signal application pad PAD is disposed, the common branch lines 610, 620, 630 and the pixel branch lines 710, 720, 730 may be alternately disposed while one or more of the branch lines are continuously disposed. For example, the first pixel branch line 710 and the first common branch line 610 may be alternately disposed while the first common branch line 610 and the second common branch line 620 are continuously disposed. The second common branch line 620 and the second pixel branch line 720 may be alternately disposed while the second pixel branch line 720 and the third pixel branch line 730 are continuously disposed.

As described above, the luminous elements 350 are disposed between the common branch lines 610, 620, 630 and the pixel branch lines 710, 720, 730 in each pixel PX. The luminous elements 350 may be aligned by receiving a dielectrophoresis force due to an electric field formed when the common branch lines 610, 620, 630 are grounded and AC power is applied to the pixel branch lines 710, 720, 730.

In this case, since the common branch lines 610, 620, 630 or the pixel branch lines 710, 720, 730 are continuously disposed in the boundary between the pixels PX in which the luminous elements 350 are not disposed, capacitance due to the electric field is not formed (or substantially not formed) even when AC power is applied. Accordingly, the drop of a voltage of AC power applied to the pixel branch lines 710, 720, 730 may be minimized or reduced, and a voltage at a similar level as that applied to a pixel PX adjacent to the AC power may also be applied to a pixel PX which is disposed at a relatively large gap from the AC power. Consequently, at a front surface of the display device 10, the drop of the voltage of AC power may be minimized or reduced, AC power having a voltage required for aligning the luminous elements 350 may be applied, and the luminous elements 350 may be uniformly (e.g., substantially uniformly) aligned in each pixel PX. This will be described in more detail herein below.

The pixel line 700 of the display device 10 according to an embodiment may include a plurality of separate lines, wherein the separate lines may be disposed to be spaced apart from each other. For example, as illustrated in FIG. 1, the pixel trunk line 750 extending in the first direction D1 may include at least one trunk separate line 750a, and the trunk separate line 750a may be aligned in the first direction D1.

For example, the pixel trunk line 750 may include a first trunk separate line 751a coupled to (e.g., connected to) the first pixel branch line 710 disposed in the first pixel PX1, a second trunk separate line 752a coupled to (e.g., connected to) the second pixel branch line 720 disposed in the second pixel PX2, and a third trunk separate line 753a coupled to (e.g., connected to) the third pixel branch line 730 disposed in the third pixel PX3. The trunk separate lines 750a may be disposed to be spaced apart from each other, and trunk spaced-apart portions 750b may be disposed between the trunk separate lines 750a. Consequently, the first trunk separate line 751a, the second trunk separate line 752a, the third trunk separate line 753a, and the trunk spaced-apart portions 750b may be aligned in the first direction D1 in which the pixel trunk line 750 extends.

In an exemplary embodiment, the pixel trunk line 750 may be electrically separated in an area which overlaps a boundary between an arbitrary pixel PX and another adjacent pixel PX. For example, the trunk spaced-apart portions 750b may be disposed in an area in which both side surfaces of an arbitrary pixel PX extend in the second direction D2 and overlap the pixel trunk line 750. Accordingly, a length of the trunk separate lines 750a measured in the first direction D1 may be substantially equal to a length of the pixels PX measured in the first direction D1. For example, by the trunk spaced-apart portions 750b being disposed at boundary surfaces at which the pixels PX are adjacent, both side portions of the trunk separate lines 750a and both side surfaces of the pixels PX may be substantially aligned. However, embodiments are not limited thereto, and the structure is not particularly limited as long as the pixel trunk line 750 may be electrically separated at every pixel PX.

Since the common trunk line 650 is electrically coupled to (e.g., electrically connected to) the plurality of common branch lines 610, 620, and 630, the common trunk line 650 may apply the same electrical signal to each of the plurality of common branch lines 610, 620, and 630. On the other hand, since the pixel trunk line 750 is separated into the plurality of trunk separate lines 750a, the pixel branch lines 710, 720, and 730 coupled to (e.g., connected to) the trunk separate lines 750a may receive different electrical signals.

In some embodiments, the plurality of trunk separate lines 750a may receive different electrical signals through different thin film transistors. Accordingly, the pixel trunk line 750 may be electrically separated by the trunk spaced-apart portions 750b, and the luminous elements 350 configured to emit different colored light may be disposed in each pixel PX and be separately operated. Even in pixels PX in which the luminous elements 350 configured to emit the same (e.g., substantially the same) colored light are disposed, different trunk separate lines 750a and the pixel branch lines 710, 720, and 730 may be disposed and separately operated. However, embodiments are not limited thereto. The branch lines included in the pixel line 700 may not necessarily be disposed in the pixel trunk line 750 and may also be disposed on each of the pixel branch lines 710, 720, and 730. This will be described in more detail herein below with reference to other embodiments.

Hereinafter, a cross-sectional structure of the luminous area LA of the display device 10 will be described in more detail with reference to FIG. 5.

FIG. 5 is a cross-sectional view taken along line I-I' of FIG. 1. FIG. 5 illustrates a cross-sectional view of a single pixel PX disposed in the luminous area LA of the display device 10 according to an embodiment.

Referring to FIGS. 1-5, the display device 10 may include a substrate 110, thin film transistors 120 and 140 disposed on the substrate 110, electrodes 330 and 340 disposed on the thin film transistors 120 and 140, and luminous elements 350. The thin film transistors may include a first thin film transistor 120, which is a driving transistor, and a second thin film transistor 140, which is a switching transistor. Each thin film transistor may include an active layer, a gate electrode, a source electrode, and a drain electrode. The pixel electrode 330 may be electrically coupled to (e.g., electrically connected to) the drain electrode of the first driving transistor.

In more detail, the substrate 110 may be an insulating substrate. The substrate 110 may include an insulating material such as glass, quartz, and/or polymer resin. Examples of the polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The substrate 110 may be a rigid substrate, but may also be a flexible substrate which is bendable, foldable, rollable, and/or the like.

A buffer layer 115 may be disposed on the substrate 110. The buffer layer 115 may prevent or reduce diffusion of impurity ions, prevent or reduce infiltration of moisture or outside air, and serve to smoothen the surface of the substrate 110. The buffer layer 115 may include silicon nitride (SiNx), silicon oxide (SiOx), silicon oxynitride (SiOxNy), and/or the like.

A semiconductor layer is disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, an oxide semiconductor, and/or the like.

A first gate insulating layer 170 is disposed on the semiconductor layer. The first gate insulating layer 170 covers the semiconductor layer. The first gate insulating layer 170 may serve as a gate insulating film of thin film transistors. The first gate insulating layer 170 may include SiOx, SiNx, SiOxNy, aluminum oxide ($Al_2O_3$), tantalum oxide, hafnium oxide, zirconium oxide, titanium oxide, and/or the like, which may be used solely or in combination.

A first conductive layer is disposed on the first gate insulating layer 170. The first conductive layer may include a first gate electrode 121 disposed on the first active layer 126 of the first thin film transistor 120, a second gate electrode 141 disposed on the second active layer 146 of the second thin film transistor 140, and a power line 161 disposed on the auxiliary layer 163, while the first gate insulating layer 170 is sandwiched between the first conductive layer and the first gate electrode 121, the second gate electrode 141, and the power line 161. The first conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The first conductive layer may include a monolayer film or a multilayer film.

A second gate insulating layer 180 is disposed on the first conductive layer. The second gate insulating layer 180 may be an interlayer insulating film. The second gate insulating layer 180 may include an inorganic insulating material such as SiOx, SiNx, SiOxNy, hafnium oxide, $Al_2O_3$, titanium oxide, tantalum oxide, zinc oxide, and/or the like.

A second conductive layer is disposed on the second gate insulating layer 180. The second conductive layer includes a capacitor electrode 128 disposed on the first gate electrode 121 while a second insulating layer is sandwiched between the second conductive layer and the capacitor electrode 128. The capacitor electrode 128 may form a reserve capacitor together with the first gate electrode 121.

Like the above-described first conductive layer, the second conductive layer may include one or more metals selected from Mo, Al, Pt, Pd, Ag, Mg, Au, Ni, Nd, Ir, Cr, Ca, Ti, Ta, W, and Cu.

An interlayer insulating layer 190 is disposed on the second conductive layer. The interlayer insulating layer 190 may be an interlayer insulating film. Further, the interlayer insulating layer 190 may serve to smoothen (e.g., planarize) the surface of the second conductive layer. The interlayer insulating layer 190 may include an organic insulating material such as a polyacrylate resin, an epoxy resin, a phenolic resin, a polyamide resin, a polyimide resin, an unsaturated polyester resin, a polyphenylenether resin, a polyphenylenesulfide resin, and/or benzocyclobutene (BCB).

A third conductive layer is disposed on the interlayer insulating layer 190. The third conductive layer includes a first drain electrode 123 and a first source electrode 124 of the first thin film transistor 120, a second drain electrode 143 and a second source electrode 144 of the second thin film transistor 140, and a power electrode 162 disposed on the power line 161.

Each of the first source electrode 124 and the first drain electrode 123 may be electrically coupled to (e.g., electrically connected to) the first active layer 126 through a first contact hole 129 which passes through the interlayer insulating layer 190 and the second gate insulating layer 180. Each of the second source electrode 144 and the second drain electrode 143 may be electrically coupled to (e.g., electrically connected to) the second active layer 146 through a second contact hole 149 which passes through the interlayer insulating layer 190 and the second gate insulating layer 180. The power electrode 162 may be electrically coupled to (e.g., electrically connected to) the power line 161 through a third contact hole 169 which passes through the interlayer insulating layer 190 and the second gate insulating layer 180.

The third conductive layer may include one or more metals selected from Al, Mo, Pt, Pd, Ag, Mg, Au, Ni, Nd, Ir, Cr, Ca, Ti, Ta, W, and Cu. The third conductive layer may include a monolayer film or a multilayer film. For example, the third conductive layer may include a laminated structure of Ti/Al/Ti, Mo/Al/Mo, Mo/AlGe/Mo, Ti/Cu, and/or the like.

An insulating substrate layer 310 is disposed on the third conductive layer. The insulating substrate layer 310 may include an organic material such as a polyacrylate resin, an epoxy resin, a phenolic resin, a polyamide resin, a polyimide resin, an unsaturated polyester resin, a polyphenylenether resin, a polyphenylenesulfide resin, and/or BCB. A surface of the insulating substrate layer 310 may be smooth.

A partition wall 380 may be disposed on the insulating substrate layer 310. At least a portion of each of the pixel line 700 and the common line 600 may be disposed on the partition wall 380. For example, the partition wall 380 may include a least one first partition wall 381 on which the pixel branch lines 710, 720, and 730 are disposed and at least one second partition wall 382 on which the common branch lines 610, 620, and 630 are disposed. Although a single first partition wall 381 and a single second partition wall 382 are illustrated in FIG. 5, partition walls which correspond to the number of branch portions may be disposed in a single pixel. For example, in the arrangement structure illustrated in FIG. 1, both the number of first partition walls 381 disposed in a single pixel and the number of second partition walls 382 disposed in the single pixel would be one.

However, embodiments are not limited thereto, and the partition wall 380 disposed on the insulating substrate layer 310 may be omitted. For example, the common branch lines 610, 620, and 630 and the pixel branch lines 710, 720, and 730 may also be directly disposed on the insulating substrate layer 310. In this case, unlike FIG. 5, a step difference formed due to members disposed on the insulating substrate layer 310 may be relatively small.

The pixel branch lines 710, 720, and 730 and the common branch lines 610, 620, and 630 disposed on the first partition wall 381 and the second partition wall 382 may include partition wall reflective layers 331, 341 and partition wall electrode layers 332, 342, which will be described below, and constitute the pixel electrode 330 and the common electrode 340. For example, at least a portion of a common line 450 and pixel lines 410, 420, and 430 disposed in each pixel PX may be the pixel electrode 330 or the common electrode 340 in the pixels PX.

A first partition wall reflective layer 331 and a second partition wall reflective layer 341 may be disposed on the partition wall 380.

The first partition wall reflective layer 331 covers the first partition wall 381 and is electrically coupled to (e.g., electrically connected to) the first drain electrode 123 of the first thin film transistor 120 through a fourth contact hole 319_1 which passes through the insulating substrate layer 310. In FIG. 1, the first partition wall reflective layer 331 is illustrated as being electrically coupled to (e.g., electrically connected to) the first drain electrode 123 of the first thin film transistor 120 through a pixel electrode contact hole CNTD disposed on pixel trunk lines 751, 752, and 753. For example, the pixel electrode contact hole CNTD may be the fourth contact hole 319_1. The pixel electrode contact hole CNTD may be disposed in the non-luminous area NLA of the display device 10, but embodiments are not limited thereto. The pixel electrode contact hole CNTD may also be disposed on the pixel branch lines 710, 720, and 730 and come into contact with the first partition wall reflective layer 331 in the luminous area LA.

The second partition wall reflective layer 341 is disposed to be spaced apart from the first partition wall reflective layer 331. The second partition wall reflective layer 341 covers the second partition wall 382 and is electrically coupled to (e.g., electrically connected to) the power electrode 162 through a fifth contact hole 319_2 which passes through the insulating substrate layer 310. In FIG. 1, the second partition wall reflective layer 341 is illustrated as being electrically coupled to (e.g., electrically connected to) the power electrode 162 of the power line 161 through a common electrode contact hole CNTS disposed on the common trunk line 650. For example, the common electrode contact hole CNTS may be the fifth contact hole 319_2. The common electrode contact hole CNTS may be disposed in the non-luminous area NLA of the display device 10, but embodiments are not limited thereto. The common electrode contact hole CNTS may also be disposed on the common branch lines 610, 620, and 630 and come into contact with the second partition wall reflective layer 341 in the luminous area LA. Since the common trunk line 650 is electrically coupled (e.g., electrically connected) between adjacent pixels PX, the common trunk line 650 may come into contact with the second partition wall reflective layer 341 through a single common electrode contact hole CNTS in the non-luminous area NLA disposed at the outside of the luminous area LA.

Meanwhile, the first partition wall reflective layer 331 and the second partition wall reflective layer 341 may reflect light emitted from the luminous elements 350, thereby transmitting light toward the outside of the display device 10. Light emitted from the luminous elements 350 is emitted in any suitable direction without directionality, and light heading toward the first partition wall reflective layer 331 and the second partition wall reflective layer 341 may be reflected and transmitted toward the outside of the display device 10, e.g., toward the top of the partition wall 380. Accordingly, light emitted from the luminous elements 350 may be focused in one direction so that optical efficiency is enhanced. In order to reflect light emitted from the luminous elements 350, the first partition wall reflective layer 331 and the second partition wall reflective layer 341 may include a material having a high reflectance. For example, the first partition wall reflective layer 331 and the second partition wall reflective layer 341 may include materials such as Ag and/or Cu, but embodiments are not limited thereto.

A first partition wall electrode layer 332 and a second partition wall electrode layer 342 may be disposed on the first partition wall reflective layer 331 and the second partition wall reflective layer 341, respectively.

The first partition wall electrode layer 332 is disposed right above the first partition wall reflective layer 331. The first partition wall electrode layer 332 may have substantially the same (e.g., substantially the same) pattern as the first partition wall reflective layer 331.

The second partition wall electrode layer 342 is disposed right above the second partition wall reflective layer 341. The second partition wall electrode layer 342 is disposed to be separated from the first partition wall electrode layer 332. The second partition wall electrode layer 342 may have substantially the same (e.g., substantially the same) pattern as the second partition wall reflective layer 341.

In one embodiment, the first partition wall electrode layer 332 may cover the first partition wall reflective layer 331 disposed below the first partition wall electrode layer 332 and the second partition wall electrode layer 342 may cover the second partition wall reflective layer 341 disposed below the second partition wall electrode layer 342. For example, the first partition wall electrode layer 332 and the second partition wall electrode layer 342 may be formed larger than the first partition wall electrode layer 332 and the second partition wall reflective layer 341 and cover end side surfaces of the first partition wall electrode layer 332 and the second partition wall electrode layer 342. However, embodiments are not limited thereto.

The first partition wall electrode layer 332 and the second partition wall electrode layer 342 may transmit electrical signals transmitted to the first partition wall reflective layer 331 and the second partition wall reflective layer 341 to contact electrodes which will be described below. The partition wall electrode layers 332 and 342 may include a transparent conductive material. For example, the first partition wall electrode layer 332 and the second partition wall electrode layer 342 may include materials such as indium tin oxide (ITO), indium zinc oxide (IZO), indium tin-zinc oxide (ITZO), and/or the like, but embodiments are not limited thereto.

The first partition wall reflective layer 331 and the first partition wall electrode layer 332 disposed on the first partition wall 381 constitute the pixel branch lines 610, 620, and 630, and the pixel branch lines 610, 620, and 630 constitute the pixel electrode 330. The pixel electrode 330 may protrude to an area which extends from both ends of the first partition wall 381, and accordingly, the pixel electrode 330 may come into contact with the insulating substrate layer 310 in the area in which the pixel electrode 330 protrudes. The second partition wall reflective layer 341 and the second partition wall electrode layer 342 disposed on the second partition wall 382 constitute a common branch line 450b, and the common branch line 450b constitutes the common electrode 340. The common electrode 340 may protrude to an area which extends from both ends of the second partition wall 382, and accordingly, the common electrode 340 may come into contact (e.g., physical contact) with the insulating substrate layer 310 in the area in which the common electrode 340 protrudes.

For example, the pixel branch lines 710, 720, 730 and the common branch lines 610, 620, 630 may include the partition wall reflective layers 331, 341 and the partition wall electrode layers 332, 342, respectively, and have a structure in which the partition wall reflective layers 331, 341 and the partition wall electrode layers 332, 342 are laminated. In addition, as described above, the pixel branch lines 710, 720, 730 and the common branch lines 610, 620, 630 may constitute the pixel electrode 330 and the common electrode 340, respectively. However, embodiments are not limited thereto.

The pixel electrode 330 and the common electrode 340 may be disposed to cover the entire (e.g., substantially the entire) area of the first partition wall 381 and the entire (e.g., substantially the entire) area of the second partition wall 382, respectively. However, the pixel electrode 330 and the common electrode 340 are disposed opposite to each other and spaced apart from each other. In a space in which the pixel electrode 330 and the common electrode 340 are spaced apart, a first insulating layer 510 may be disposed, and the luminous elements 350 may be disposed thereon as will be described below.

Since the first partition wall reflective layer 331 may receive a driving voltage from the first thin film transistor 120 and the second partition wall reflective layer 341 may receive a power voltage from the power line 161, the pixel electrode 330 and the common electrode 340 receive the driving voltage and the power voltage, respectively. As will be described below, a first contact electrode 360 and a second contact electrode 370 disposed on the pixel electrode 330 and the common electrode 340 may transmit the driving voltage and the power voltage to the luminous elements 350, and the luminous elements 350 may emit light as a set or predetermined current flows in the luminous elements 350.

The first insulating layer 510 is disposed on a partial area of the pixel electrode 330 and the common electrode 340. The first insulating layer 510 may be disposed in a space between the pixel electrode 330 and the common electrode 340. In a plan view, the first insulating layer 510 may have the form of an island or a linear shape formed along the space between the pixel electrode 330 and the common electrode 340.

The luminous elements 350 are disposed on the first insulating layer. The first insulating layer 510 may be disposed between the luminous elements 350 and the insulating substrate layer 310. A lower surface of the first insulating layer 510 may come into contact with the insulating substrate layer 310, and the luminous elements 350 may be disposed at an upper surface of the first insulating layer 510. Both side surfaces of the first insulating layer 510 may come into contact with the pixel electrode 330 and common electrodes 340, and the first insulating layer 510 may electrically insulate the pixel electrode 330 and the common electrodes 340 from each other.

The first insulating layer 510 may overlap with partial regions of the pixel electrode 330 and the common electrode 340, e.g., with portions of areas in which the pixel electrode 330 and the common electrode 340 protrude in directions opposite to each other. For example, ends of the both side surfaces of the first insulating layer 510 may cover an upper surface of the area in which the pixel electrode 330 and the common electrode 340 protrude in the directions opposite to each other. The first insulating layer 510 may protect areas which overlap with the pixel electrode 330 and the common electrode 340 and electrically insulate the areas from the pixel electrode 330 and the common electrode 340. By preventing or reducing a first semiconductor layer 351 and a second semiconductor layer 352 of the luminous elements 350 from directly coming into contact with other base materials, the first insulating layer 510 may prevent or reduce damage to the luminous elements 350.

Although surfaces at which the first insulating layer 510 comes into contact with the pixel electrode 330 and the common electrode 340 are illustrated in FIG. 5 as being aligned with both side surfaces of the luminous elements 350, embodiments are not limited thereto. For example, a length of the first insulating layer 510 may be greater than a length of the luminous elements 350, and thus the first insulating layer 510 may protrude past the both side surfaces of the luminous elements 350. Accordingly, side surfaces of the first insulating layer 510 and the luminous elements 350 may be laminated in a stair shape (e.g., a step shape).

At least one luminous element 350 may be disposed between the pixel electrode 330 and the common electrode 340. The case in which luminous elements 350 configured to emit the same (e.g., substantially the same) colored light are disposed in each pixel PX is illustrated in FIG. 1 as an example. However, embodiments are not limited thereto, and as described above, the luminous elements 350 configured to emit different colored light may also be disposed together in a single pixel PX.

The pixel electrode 330 and the common electrode 340 may be disposed to be spaced apart at a set or predetermined gap, and the gap at which the pixel electrode 330 and the common electrode 340 are spaced apart may be less than or equal to the length of the luminous elements 350. Accordingly, electrical contact between the luminous elements 350 and the pixel electrode 330 and between the luminous elements 350 and the common electrode 340 may be facilitated.

The luminous elements 350 may be an LED. The luminous elements 350 may be a nanostructure whose size is generally in a nano unit. The luminous elements 350 may be an inorganic LED include an inorganic material. In the case in which the luminous elements 350 are an inorganic LED, when a luminous material having an inorganic crystal structure is disposed between two electrodes disposed opposite to each other and an electric field is formed in the luminous material in a set or specific direction, the inorganic LED may be aligned between the two electrodes in which a set or specific polarity is formed. This will be described in more detail herein below.

A second insulating layer 520 may be disposed on the luminous elements 350, protect the luminous elements 350, and fix the luminous elements 350 between the pixel electrode 330 and the common electrode 340. In some embodiments, the second insulating layer 520 may also be disposed at an outer surface of the luminous elements 350 and fix the luminous elements 350. The second insulating layer 520 may be disposed at a partial area of the outer surface of the luminous elements 350. The second insulating layer 520 may be disposed such that both side surfaces of the luminous elements 350 are exposed. For example, the length of the second insulating layer 520 may be shorter than that of the luminous elements 350, and thus the second insulating layer 520 may be recessed more inward than the both side surfaces of the luminous elements 350. Accordingly, side surfaces of the first insulating layer 510, the luminous elements 350, and the second insulating layer 520 may be laminated in a stair shape (e.g., a step shape). In this case, like the first insulating layer 510, by the second insulating layer 520 being disposed as described above, contact of the first contact electrode 360 and the second contact electrode 370 may be facilitated at the side surfaces of the luminous elements 350.

However, embodiments are not limited thereto, and the lengths of the second insulating layer 520 and the luminous elements 350 may be equal, and both side portions thereof may be aligned. In addition, when the second insulating layer 520 and the first insulating layer 510 are concurrently (e.g., simultaneously) patterned, both side portions of the second insulating layer 520 may be aligned with both side portions of the luminous elements 350 and the first insulating layer 510.

The first contact electrode 360 which is disposed on the pixel electrode 330 and overlaps with at least a portion of the second insulating layer 520 and the second contact electrode 370 which is disposed on the common electrode 340 and comes into contact with at least a portion of the second insulating layer 520 even when disposed to be spaced apart from the first contact electrode 360 may be included on the second insulating layer 520.

The first contact electrode 360 and the second contact electrode 370 may be disposed at an upper surface of the pixel electrode 330 and an upper surface of the common electrode 340, respectively. For example, the first contact electrode 360 and the second contact electrode 370 may come into contact with the first partition wall electrode layer 332 and the second partition wall electrode layer 342, respectively, at the upper surfaces of the pixel electrode 330 and the common electrode 340. The first contact electrode 360 and the second contact electrode 370 may respectively come into contact with the first semiconductor layer 351 and the second semiconductor layer 352 of the luminous elements 350. Accordingly, the first contact electrode 360 and the second contact electrode 370 may transmit electrical signals applied to the first partition wall electrode layer 332 and the second partition wall electrode layer 342 to the luminous elements 350.

The first contact electrode 360 may be disposed on the pixel electrode 330 to cover the pixel electrode 330, and a portion of a lower surface of the first contact electrode 360 may come into contact with the luminous elements 350 and the second insulating layer 520. One end of the first contact electrode 360 in a direction in which the common electrode 340 is disposed on the second insulating layer 520. The second contact electrode 370 may be disposed on the common electrode 340 to cover the common electrode 340, and a portion of a lower surface of the second contact electrode 370 may come into contact with the luminous elements 350, the second insulating layer 520, and a third insulating layer 530. One end of the second contact electrode 370 in a direction in which the pixel electrode 330 is disposed on the third insulating layer 530.

The first contact electrode 360 and the second contact electrode 370 may be disposed to be spaced apart from each other on the second insulating layer 520 or the third insulating layer 530. For example, both the first contact electrode 360 and the second contact electrode 370 may come into contact with the luminous elements 350 and the second insulating layer 520 or the third insulating layer 530, but the first contact electrode 360 and the second contact electrode 370 may be disposed to be spaced apart from each other on the second insulating layer 520. Thus, the first contact electrode 360 and the second contact electrode 370 may not be coupled to (e.g., connected to) each other. Because of this, the first contact electrode 360 and the second contact electrode 370 may receive different powers from the first thin film transistor 120 and the power line 161. For example, the first contact electrode 360 may receive the driving voltage applied from the first thin film transistor 120 to the pixel electrode 330, and the second contact electrode 370 may receive the power voltage applied from the power line 161 to the common electrode 340. However, embodiments are not limited thereto.

The first contact electrode 360 and the second contact electrode 370 may include a conductive material. For example, the first contact electrode 360 and the second contact electrode 370 may include ITO, IZO, ITZO, Al, and/or the like. However, embodiments are not limited thereto.

The first contact electrode 360 and the second contact electrode 370 may include the same (e.g., substantially the same) material as that of the first partition wall electrode layer 332 and the second partition wall electrode layer 342. In order to come into contact with the first partition wall electrode layer 332 and the second partition wall electrode layer 342, the first contact electrode 360 and the second contact electrode 370 may be disposed in substantially the same (e.g., substantially the same) pattern on the first partition wall electrode layer 332 and the second partition wall electrode layer 342. The first contact electrode 360 and the second contact electrode 370 coming into contact with the first partition wall electrode layer 332 and the second partition wall electrode layer 342 may receive electrical signals applied to the first partition wall electrode layer 332 and the second partition wall electrode layer 342 and transmit the received electrical signals to the luminous elements 350.

The third insulating layer 530 may be disposed on the first contact electrode 360 and electrically insulate the first contact electrode 360 and the second contact electrode 370 from each other. The third insulating layer 530 may be disposed to cover the first contact electrode 360 while disposed not to overlap with partial areas of the luminous elements 350 so that the luminous elements 350 may be coupled to (e.g., connected to) the second contact electrode 370. A portion of the third insulating layer 530 may come into contact with the first contact electrode 360 and the second insulating layer 520 at an upper surface of the second insulating layer 520. The third insulating layer 530 may be disposed to cover one end of the first contact electrode 360 at the upper surface of the second insulating layer 520. Accordingly, the third insulating layer 530 may protect the first contact electrode 360 and electrically insulate the first contact electrode 360 from the second contact electrode 370.

One end of the third insulating layer 530 in the direction in which the common electrode 340 is disposed may be aligned with one side surface of the second insulating layer 520.

Meanwhile, in some embodiments, the third insulating layer 530 may be omitted from the display device 10. Accordingly, the first contact electrode 360 and the second contact electrode 370 may be disposed on substantially the same (e.g., substantially the same) plane, and the first contact electrode 360 and the second contact electrode 370 may be electrically insulated from each other by a passivation layer 550 which will be further described herein below. This will be described in more detail herein below with reference to other embodiments.

The passivation layer 550 may be formed on the third insulating layer 530 and the second contact electrode 370 and serve to protect members disposed on the insulating substrate layer 310 from an external environment. When the first contact electrode 360 and the second contact electrode 370 are exposed, since a problem in that materials of the contact electrodes are disconnected due to damage to the electrodes may occur, the first contact electrode 360 and the second contact electrode 370 may be covered by the passivation layer 550. For example, the passivation layer 550 may be disposed to cover the pixel electrode 330, the common electrode 340, the luminous elements 350, and/or the like. Also, when the third insulating layer 530 is omitted as described above, the passivation layer 550 may be formed on the first contact electrode 360 and the second contact electrode 370. In this case, the passivation layer 550 may electrically insulate the first contact electrode 360 and the second contact electrode 370 from each other.

Each of the above-described first insulating layer 510, second insulating layer 520, third insulating layer 530, and passivation layer 550 may include an inorganic insulating material. For example, the first insulating layer 510, the second insulating layer 520, the third insulating layer 530, and the passivation layer 550 may include materials such as SiOx, SiNx, SiOxNy, $Al_2O_3$, and/or aluminum nitride (AlN). The first insulating layer 510, the second insulating layer 520, the third insulating layer 530, and the passivation layer 550 may include the same (e.g., substantially the same) material, but may also include different materials. Various other suitable materials which provide an insulating property to the first insulating layer 510, the second insulating layer 520, the third insulating layer 530, and the passivation layer 550 may be applied thereto.

As described above, the display device 10 according to an embodiment may include the pixel electrode 330, the common electrode 340, and the luminous elements 350 disposed between the pixel electrode 330 and the common electrode 340. The luminous elements 350 may receive electrical signals from the first contact electrode 360 and the second contact electrode 370 and emit light in a set or specific wavelength band.

Meanwhile, the luminous elements 350 may be manufactured using an epitaxial growth method on the substrate. A seed crystal layer for forming the semiconductor layer may be formed on the substrate, a desired semiconductor material may be deposited thereon, and the desired semiconductor material may be caused to grow. Hereinafter, a structure of luminous elements 350 according to various embodiments will be described in more detail herein below with reference to FIG. 6.

Figure 6A:
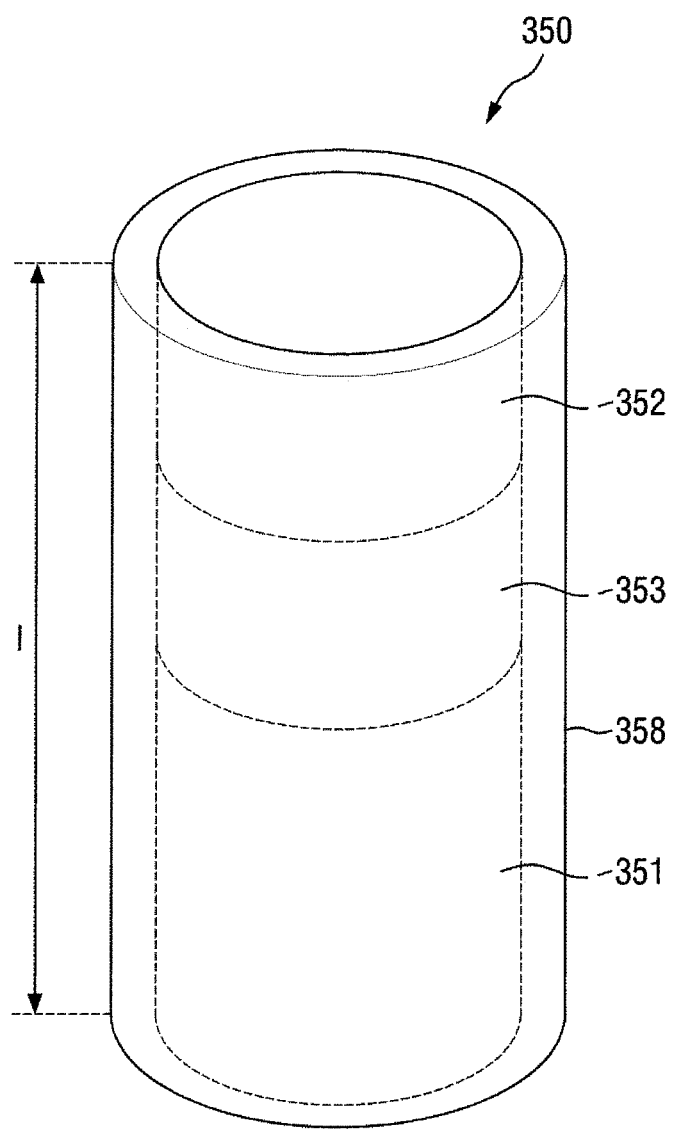
FIG. 6A is a schematic diagram of a luminous element according to an embodiment.

FIG. 6A is a schematic diagram of a luminous element according to an embodiment.

Referring to FIG. 6A, a luminous element 350 may include a plurality of semiconductor layers 351 and 352 and an active material layer 353 disposed between the plurality of semiconductor layers 351 and 352. Electrical signals applied from the pixel electrode 330 and the common electrode 340 may be transmitted to the active material layer 353 through the plurality of semiconductor layers 351 and 352, and the luminous element 350 may emit light.

For example, the luminous element 350 may include a first semiconductor layer 351, a second semiconductor layer 352, the active material layer 353 disposed between the first semiconductor layer 351 and the second semiconductor layer 352, and an insulating material layer 358. FIG. 6A illustrates an example in which the luminous element 350 has a structure in which the first semiconductor layer 351, the active material layer 353, and the second semiconductor layer 352 are sequentially laminated in a longitudinal direction.

The first semiconductor layer 351 may be an n-type semiconductor layer. For example, when the luminous element 350 emits light in a blue wavelength band, the first semiconductor layer 351 may be a semiconductor material having a chemical formula, $In_xAl_yGa_{1-x-y}N$ ($0 \leq x \leq 1$, $0 \leq y \leq 1$, $0 \leq x+y \leq 1$). For example, the first semiconductor layer 351 may be any one or more selected from InAlGaN, GaN, AlGaN, InGaN, AlN, and InN doped with an n-type material. The first semiconductor layer 351 may be doped with a first conductive dopant, and for example, the first conductive dopant may include Si, Ge, Sn, and/or the like. A length of the first semiconductor layer 351 may be in a range of 1.5 μm to 5 μm, but embodiments are not limited thereto.

The second semiconductor layer 352 may be a p-type semiconductor layer. For example, when the luminous element 350 emits light in a blue wavelength band, the second semiconductor layer 352 may be a semiconductor material having a chemical formula, $In_xAl_yGa_{1-x-y}N$ ($0 \leq x \leq 1$, $0 \leq y \leq 1$, $0 \leq x+y \leq 1$). For example, the second semiconductor layer 352 may be any one or more selected from InAlGaN, GaN, AlGaN, InGaN, AlN, and InN doped with a p-type material. The second semiconductor layer 352 may be doped with a second conductive dopant, and for example, the second conductive dopant may include Mg, Zn, Ca, Se, Ba, and/or the like. A length of the second semiconductor layer 352 may be in a range of 0.08 μm to 0.25 μm, but embodiments are not limited thereto.

The active material layer 353 may be disposed between the first semiconductor layer 351 and the second semiconductor layer 352 and include a material of a single quantum well structure or a multiple quantum well structure. When the active material layer 353 includes the material of the multiple quantum well structure, the active material layer 353 may have a structure in which a plurality of quantum layers and well layers are alternately laminated. The active material layer 353 may emit light due to recombination of electron-hole pairs according to electrical signals applied to the active material layer 353 through the first semiconductor layer 351 and the second semiconductor layer 352. For example, when the active material layer 353 emits light in a blue wavelength band, the active material layer 353 may include materials such as AlGaN and/or AlInGaN. In some embodiments, when the active material layer 353 has the multiple quantum well structure in which the quantum layers and the well layers are alternately laminated, the quantum layers may include materials such as AlGaN and/or AlInGaN, and the well layers may include materials such as GaN and/or AlGaN. However, embodiments are not limited thereto. The active material layer 353 may also have a structure in which semiconductor materials having high band gap energy and semiconductor materials having low band gap energy are alternately laminated and may include different semiconductor materials in Groups 3 or 5 according to a wavelength band of light being emitted. Accordingly, light emitted by the active material layer 353 is not limited to light in a blue wavelength band, and the active material layer 353 may also emit light in a red or green wavelength band in some cases. A length of the active material layer 353 may be in a range 0.05 μm to 0.25 μm, but embodiments are not limited thereto.

Light emitted from the active material layer 353 may be emitted not only to longitudinal outer surfaces of the luminous element 350 but also to both side surfaces of the luminous element 350. For example, the directionality of light emitted from the active material layer 353 is not limited to a single direction.

The insulating material layer 358 may be formed at an outer portion of the luminous element 350 and protect the luminous element 350. For example, the insulating material layer 358 may be formed to surround side portions of the luminous element 350 and may not be formed at both longitudinal ends of the luminous element 350, e.g., both ends thereof at which the first semiconductor layer 351 and the second semiconductor layer 352 are disposed. However, embodiments are not limited thereto. The insulating material layer 358 may include materials having an insulating property, e.g., $SiO_x$, $SiN_x$, $SiO_xN_x$, AlN, $Al_2O_3$, and/or the like. Accordingly, an electrical short circuit that may occur when the active material layer 353 directly comes into contact with the pixel electrode 330 or the common electrode 340 may be prevented or reduced. Also, since the insulating material layer 358 includes the active material layer 353 and protects an outer surface of the luminous element 350, degradation of luminous efficiency may be prevented or reduced.

A thickness of the insulating material layer 358 may be in a range of 0.5 μm to 1.5 μm, but embodiments are not limited thereto.

The luminous element 350 may have a cylindrical shape. However, the shape of the luminous element 350 is not limited thereto, and the luminous element 350 may have various other suitable shapes such as a cubic shape, a rectangular parallelepiped shape, a hexagonal prism shape, and the like. A length of the luminous element 350 may be in a range of 1 μm to 10 μm or 2 μm to 5 μm. For example, the luminous element 350 may have a length of about 4 μm. A diameter of the luminous element 350 may be in a range of 400 nm to 700 nm. In some embodiments, the luminous element 350 may have a thickness of about 500 nm.

Figure 6B:
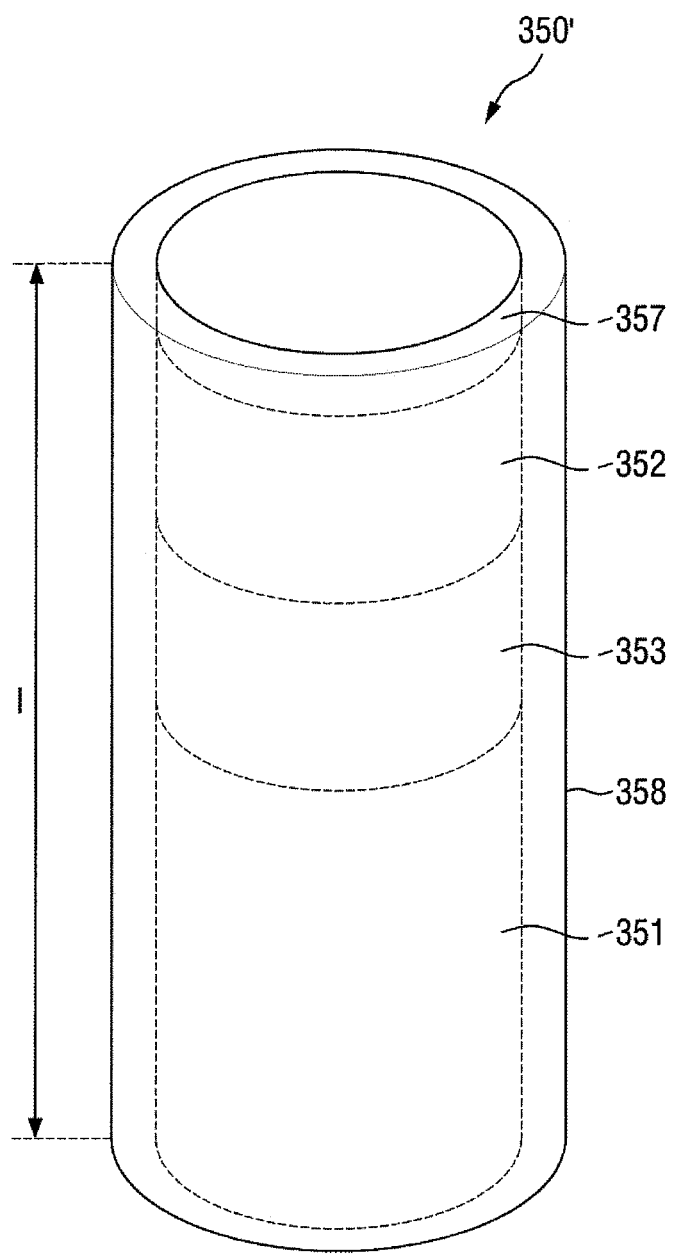
FIGS. 6B-6C are schematic diagrams of luminous elements according to other embodiments.
Figure 6C:
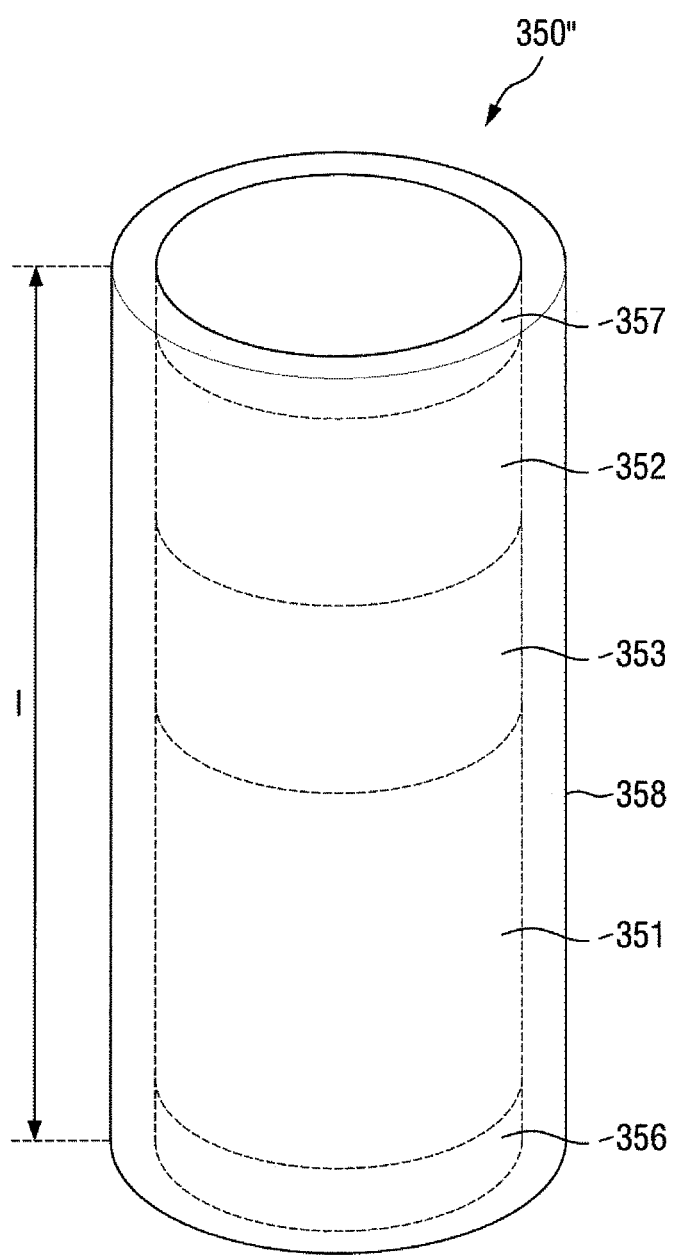

FIGS. 6B-6C are schematic diagrams of luminous elements according to other embodiments.

Referring to FIGS. 6B-6C, luminous elements 350' and 350" may further include electrode layers 356 and 357 disposed on at least one of the both side surfaces at which the first semiconductor layer 351 and the second semiconductor layer 352 are disposed.

FIG. 6B illustrates an example in which the luminous element 350' further includes an electrode layer 357 disposed only at the second semiconductor layer 352. FIG. 6C illustrates an example in which the luminous element 350" further includes electrode layer 356 and 357 respectively disposed at the first semiconductor layer 351 and the second semiconductor layer 352. For convenience of description, an electrode layer formed at one side surface at which the first semiconductor layer 351 is disposed will be referred to as a first electrode layer 356, and an electrode layer formed at the other side surface at which the second semiconductor layer 352 is disposed will be referred to as a second electrode layer 357. However, embodiments are not limited thereto, and an arbitrary electrode layer may also be referred to as a first electrode layer.

The luminous elements 350' and 350" according to different embodiments may include at least one of the first electrode layer 356 and the second electrode layer 357. In this case, the insulating material layer 358 may extend in the longitudinal direction and formed to cover the first electrode layer 356 and the second electrode layer 357. However, embodiments are not limited thereto. The insulating material layer 358 may cover only the first semiconductor layer 351, the active material layer 353, and the second semiconductor layer 352, or cover only portions of outer surfaces of the electrode layers 356 and 357 such that the outer surfaces of the first electrode layer 356 and the second electrode layer 357 are partially exposed.

The first electrode layer 356 and the second electrode layer 357 may be ohmic contact electrodes. However, embodiments are not limited thereto, and the first electrode layer 356 and the second electrode layer 357 may also be Schottky contact electrodes. The first electrode layer 356 and the second electrode layer 357 may include a metal having conductivity. For example, the first electrode layer 356 and the second electrode layer 357 may include at least one of Al, Ti, In, Au, and/or Ag. The first electrode layer 356 and the second electrode layer 357 may include the same (e.g., substantially the same) material or include different materials. However, embodiments are not limited thereto.

Hereinafter, a method of manufacturing the display device 10 according to an embodiment will be described with reference to FIGS. 7-10. The structure in which the common line 600 and the pixel line 700 of the display device 10 are disposed, the alignment of the luminous elements 350, and the like will be described in more detail with reference to FIGS. 7-10.

FIGS. 7-10 are plan views schematically illustrating a part of a method of manufacturing a display device according to an embodiment. Description will be provided below with reference to FIGS. 1 and 7-10.

Figure 7:
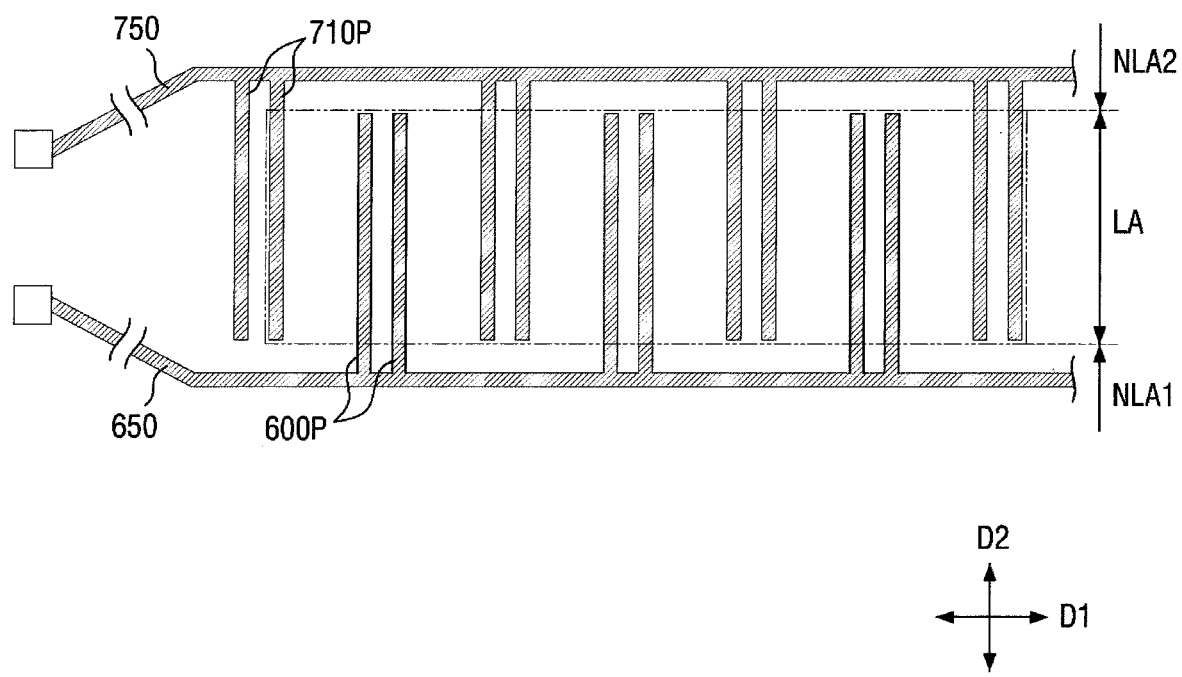
FIGS. 7-10 are plan views schematically illustrating portions of a method of manufacturing a display device according to an embodiment.

First, referring to FIG. 7, an anode-cathode layer ACL on which the plurality of lines 600 and 700 are disposed is formed on the insulating substrate layer 310. Forming the plurality of lines 600 and 700 may include performing a general masking process and patterning metals, organic materials, or the like so as to form the plurality of lines 600 and 700. For example, a metal layer may be deposited on the insulating substrate layer 310, and the deposited metal layer may be patterned so that the anode-cathode layer ACL on which the plurality of lines 600 and 700 are disposed is formed. In an exemplary embodiment, the plurality of lines 600 and 700 may include a common line 600 and a pixel line 700.

As described above, the display device 10 may include an area defined by a luminous area LA and a non-luminous area NLA. Accordingly, patterning is performed so that a common truck line 650 and a pixel truck line 750 are disposed to be spaced apart from each other in the non-luminous area NLA on the insulating substrate layer 310. In an exemplary embodiment, the common truck line 650 may be disposed in a first non-luminous area NLA1 disposed below the luminous area LA from among the non-luminous area NLA, and the pixel truck line 750 may be disposed in a second non-luminous area NLA2 disposed above the luminous area LA from among the non-luminous area NLA. Each of the common truck line 650 and the pixel truck line 750 may extend in a first direction D1. Since a more detailed arrangement structure of the common truck line 650 and the pixel truck line 750 is the same as that described above with reference to FIG. 1, redundant descriptions thereof will not be repeated here.

Branch lines, e.g., a common branch pattern 600P and a pixel branch pattern 700P, which branch off and extend from each trunk line may be disposed in the luminous area LA of the insulating substrate layer 310. At least one common branch pattern 600P may be spaced apart from the common trunk line 650 and branch off therefrom. The common branch pattern 600P may extend in a second direction D2, which is a direction intersecting the first direction D1, be spaced apart from the pixel trunk line 750, and be terminated. Although the common branch pattern 600P is illustrated in FIG. 7 as branching off upward from the common trunk line 650, embodiments are not limited thereto.

At least one pixel branch pattern 700P may be spaced apart from the pixel trunk line 750 and branch off therefrom. The pixel branch pattern 700P may extend in the second direction D2, which is a direction intersecting the first direction D1, be spaced apart from the common trunk line 650, and be terminated. Although the pixel branch pattern 700P is illustrated in FIG. 7 as branching toward the bottom of the pixel trunk line 750, embodiments are not limited thereto.

Two or more common branch patterns 600P and two or more pixel branch patterns 700P form a pair and branch off, and the common branch patterns 600P and the pixel branch patterns 700P are disposed opposite to each other and spaced apart from each other. Regarding the common branch patterns 600P and the pixel branch patterns 700P disposed on the luminous area LA of the insulating substrate layer 310, the patterns forming pairs may be alternately disposed in the first direction D1. An area in which the common branch pattern 600P and the pixel branch pattern 700P are spaced apart may be an area in which the luminous elements 350 are aligned, and an area in which the common branch pattern 600P and the pixel branch pattern 700P form a pair and are spaced apart may be an area in which the luminous elements 350 are not aligned. The plurality of luminous elements 350 may be aligned in the area in which the common branch pattern 600P and the pixel branch pattern 700P are spaced apart from each other, and the common branch lines 610, 620, and 630 and the pixel branch lines 710, 720, and 730 may be configured therein. Since the structure, arrangement, or the like of the common branch pattern 600P and the pixel branch pattern 700P are the same (e.g., substantially the same) as those of the common branch lines 610, 620, and 630 and the pixel branch lines 710, 720, and 730, redundant descriptions thereof will not be repeated here.

Figure 8:
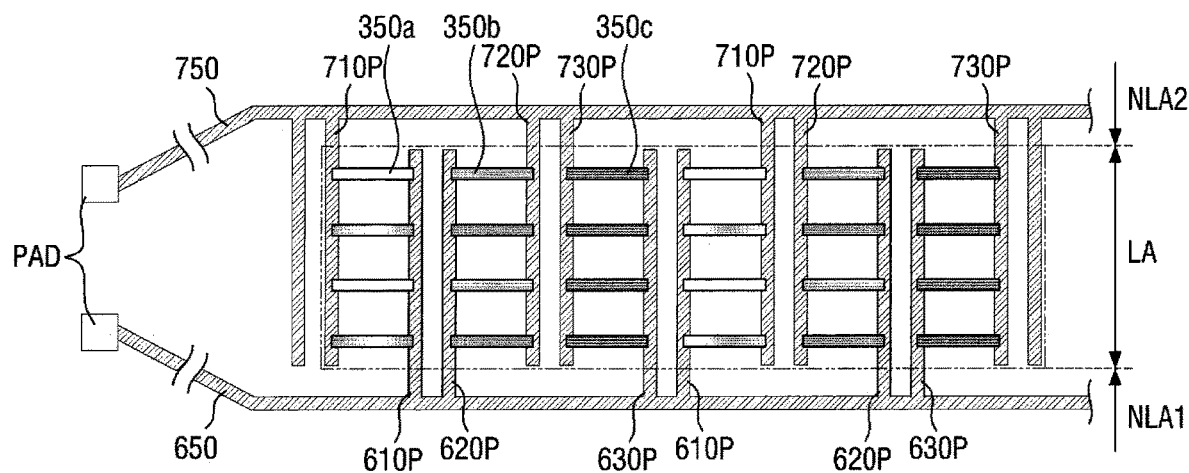

Next, referring to FIG. 8, the plurality of luminous elements 350 are aligned in the area in which the common branch pattern 600P and the pixel branch pattern 700P are spaced apart from each other. In this case, the plurality of luminous elements 350 may emit the same (e.g., substantially the same) colored light, but embodiments are not limited thereto. In an exemplary embodiment, the luminous elements 350 may include a first luminous element 350a configured to emit red light, a second luminous element 350b configured to emit green light, and a third luminous element 350c configured to emit blue light. The first luminous element 350a, the second luminous element 350b, and the third luminous element 350c may be aligned in the area in which different common branch patterns 600P and pixel branch patterns 700P are spaced apart.

For example, the first luminous element 350a may be aligned between a first pixel branch pattern 710P and a first common branch pattern 610P, the second luminous element 350b may be aligned between a second pixel branch pattern 720P and a second common branch pattern 620P, and the third luminous element 350c may be aligned between a third pixel branch pattern 730P and a third common branch pattern 630P. Accordingly, the luminous elements 350a, 350b, and 350c may configure the first pixel PX1, the second pixel PX2, and the third pixel PX3, respectively.

Figure 9:
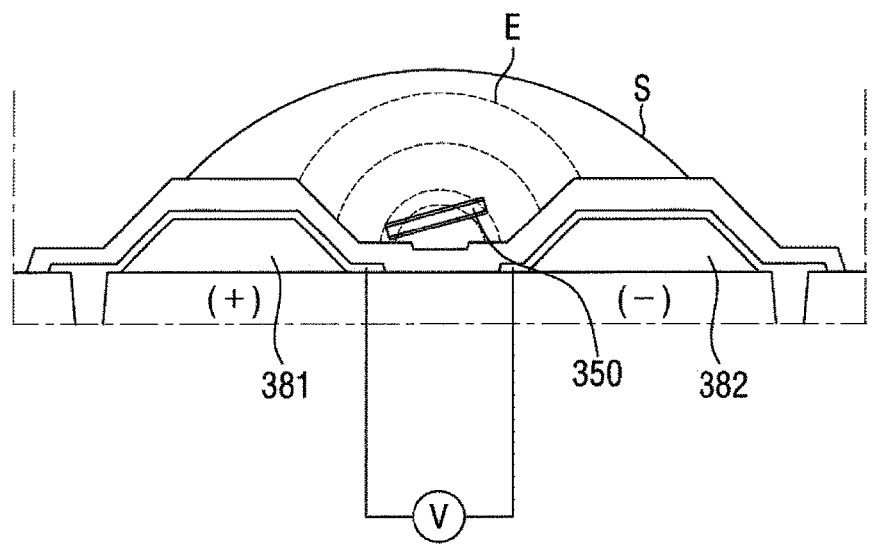

When aligning the luminous elements 350 as described above, an electric field may be formed between the common branch pattern 600P and the pixel branch pattern 700P, and dielectrophoresis may be used. This will be described in more detail below with reference to FIGS. 9-10. FIG. 9 schematically illustrates a process in which luminous elements are aligned in a display device, and FIG. 10 schematically illustrates capacitance being formed in the display device due to an electric field.

Referring to FIG. 9, a solution S which contains the luminous elements 350 may be applied on the display device 10, an electric field E may be formed, and a dielectrophoresis force may be applied to the luminous elements 350 to align the luminous elements 350. At least some of the plurality of lines 600 and 700, e.g., the common branch pattern 600P and the pixel branch pattern 700P, disposed on the insulating substrate layer 310 may be utilized in forming the electric field E in the pixels PX so as to align the luminous elements 350. The electric field E may apply a dielectrophoresis force to the luminous elements 350 contained in the solution S applied on the insulating substrate layer 310. In some embodiments, a dielectrophoresis force may be applied to the luminous elements 350 so that the luminous elements 350 are aligned with ends of the common branch pattern 600P and the pixel branch pattern 700P facing each other.

As described above with reference to FIG. 5, the first partition wall 381 and the second partition wall 382 may be disposed on the insulating substrate layer 310, and the partition wall reflective layers 331, 341 and the partition wall electrode layers 332, 342 may be disposed thereon. In this case, the partition wall reflective layers 331, 341 and the partition wall electrode layers 332, 342 may configure the common branch pattern 600P and the pixel branch pattern 700P on the first partition wall 381 and the second partition wall 382. However, for convenience of description, it is illustrated in FIG. 9 that a common branch pattern 600P includes a single layer and a pixel branch pattern 700P includes a single layer are formed on the partition walls 381 and 382, respectively. However, embodiments are not limited thereto, and it should be understood with reference to other drawings that the above-described case is within the scope of the present disclosure.

Figure 10:
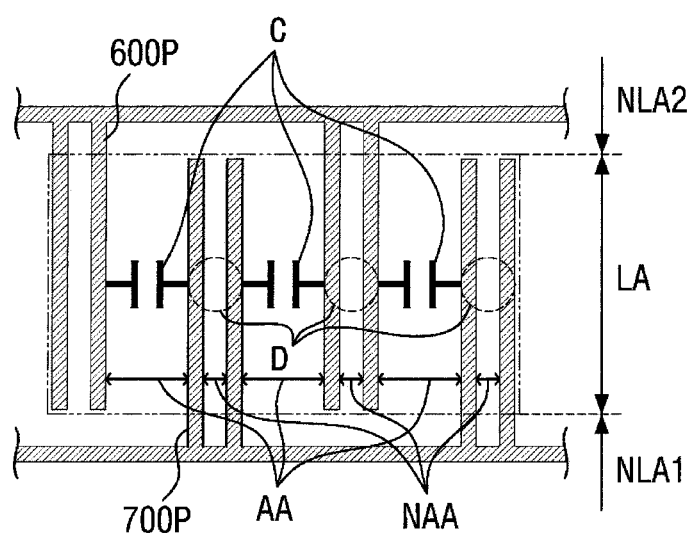

Referring to FIG. 10, an alignment area AA in which the luminous elements 350 are aligned and a non-alignment area NAA in which the luminous elements 350 are not aligned may be defined between the common branch pattern 600P and the pixel branch pattern 700P disposed to be spaced apart from each other. When one end of the common branch pattern 600P is grounded (GND), and AC power is applied to the pixel branch pattern 700P, capacitance C due to the electric field may be formed in the common branch pattern 600P and the pixel branch pattern 700P disposed to be spaced apart from each other. For example, the capacitance C due to the AC power may be formed only in the alignment area AA and may not be formed in the non-alignment area NAA or area D of FIG. 10.

The AC power may be applied from the signal application pad PAD coupled to (e.g., connected to) one end of the pixel trunk line 750 and be transmitted to the pixel branch pattern 700P. An intensity of a voltage of the AC power may progressively weaken toward the other side portion of the pixel trunk line 750 which extends in the first direction D1 or toward an end of the pixel branch pattern 700P which branches off in the second direction D2.

At least some of the common branch patterns 600P and pixel branch patterns 700P may be continuously disposed in the display device 10 according to an embodiment such that the capacitance C due to the AC power is only formed in the alignment area AA without being formed in the non-alignment area NAA. Accordingly, the drop of the voltage of the AC power may be minimized or reduced, and the AC power may be uniformly (e.g., substantially uniformly) applied to the front surface of the display device 10. Accordingly, an alignment failure may be solved by the luminous elements 350 being aligned only in the alignment area AA and the minimum voltage intensity required for the alignment of luminous elements 350 being maintained.

In some embodiments, at least a portion of the pixel trunk line 750 is patterned to form the trunk separate lines 750a and the trunk spaced-apart portions 750b. The patterning may include a general masking process, but embodiments are not limited thereto. The patterning may also include disconnecting a line using laser. The trunk separate lines 750a may be electrically separated from each other, be coupled to (e.g., connected to) the pixel branch lines 610, 620, and 630, and apply different electrical signals thereto. More detailed descriptions thereof have been provided herein above.

When the pixel trunk line 750 is separated due to the trunk separate lines 750a, each pixel may have a structure of the first type pixel Flip 1 or the second type pixel Flip 2. For example, the first pixel branch line 710 and the first common branch line 610 have the same (e.g., substantially the same) structure as the first type pixel Flip 1. In the case of the second pixel PX2 adjacent to the first pixel PX1, the second common branch line 620 and the second pixel branch line 720 have the structure of the second type pixel Flip 2. The first pixel PX1 and the second pixel PX2 have symmetrical structures (e.g., substantially symmetrical structures) with respect to a boundary therebetween, and the first pixel branch line 710 and the second common branch line 620 are respectively disposed at the left and the right of the first common branch line 610. The capacitance C due to the AC power is not generated between (or not substantially generated between) the first common branch line 610 and the second common branch line 620.

In the case of the second pixel branch line 720, the third pixel branch line 730 may be disposed at the right thereof in the drawings, and the third common branch line 630 may be disposed in the structure of the first type pixel Flip 1. The second pixel branch line 720 and the third common branch line 630 may be respectively disposed at the left and the right of the third pixel branch line 730. Since the capacitance due to the AC power is not generated between (or not substantially generated between) the second pixel branch line 720 and the third pixel branch line 730, the luminous elements 350 are not aligned between the second pixel branch line 720 and the third pixel branch line 730.

The display device 10 of FIG. 1 may be manufactured using the above-described method. In the display device 10, some of the common branch lines 610, 620, 630 and the pixel branch lines 710, 720, 730 may be continuously branched. In the pixels PX in which the common branch lines 610, 620, 630 and the pixel branch lines 710, 720, 730 are disposed, the arrangement structures of the branch lines may be symmetrical (e.g., substantially symmetrical) with respect to boundaries between the pixels PX. Accordingly, when aligning the luminous elements 350, formation of unnecessary capacitance C in the non-alignment area NAA may be prevented or reduced, and the drop of the voltage of the AC power may be minimized or reduced. Consequently, luminous elements 350 may be uniformly (e.g., substantially uniformly) aligned throughout the entire (e.g., substantially the entire) area of the display device 10.

Hereinafter, other embodiments of the present disclosure will be described. Examples of possible structures, arrangement relationships, or the like of a plurality of lines 400 disposed in a display device 10 will be described in the other embodiments which will be described with reference to other drawings. However, the present disclosure is not necessarily limited thereto.

First, the structure and arrangement of separate lines according to another embodiment will be described with reference to FIGS. 11-12.

Figure 11:
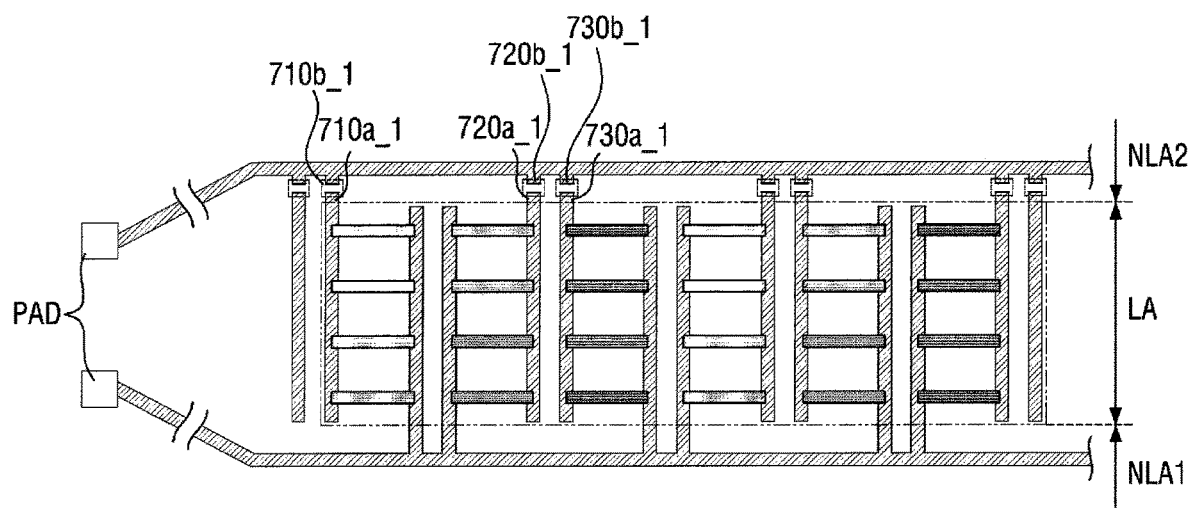
FIGS. 11-12 are plan views of display devices according to other embodiments.
Figure 12:
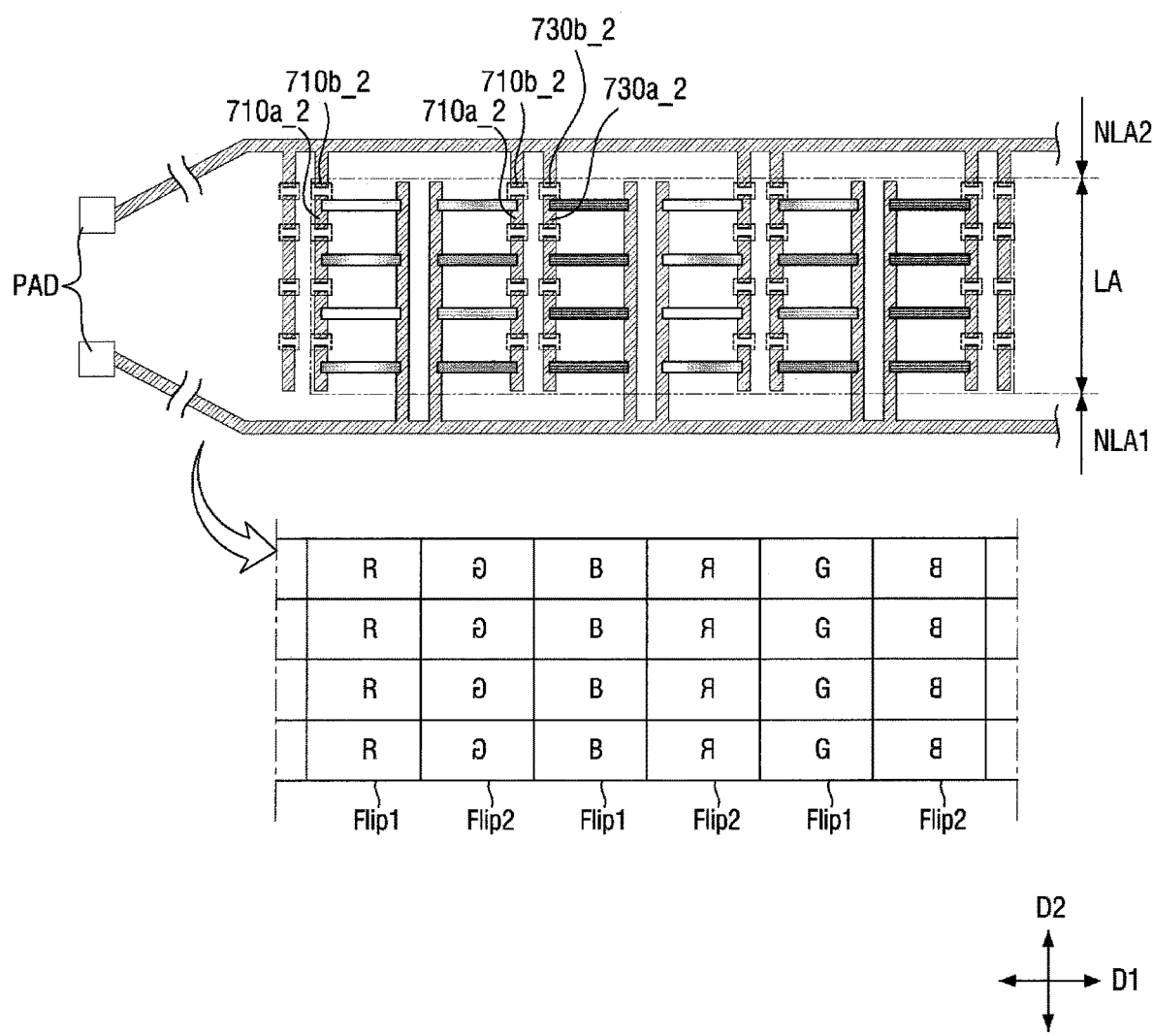

FIGS. 11-12 are plan views of display devices according to other embodiments.

Referring to FIG. 11, in a display device 10_1 according to another embodiment, pixel branch lines 710_1, 720_1, and 730_1 may include branch separate lines 710a_1, 720a_1, and 730a_1, respectively. In addition, the pixel branch lines 710_1, 720_1, and 730_1 include branch spaced-apart portions 710b_1, 720b_1, and 730b_1, respectively, and the branch separate lines 710a_1, 720a_1, and 730a_1 may be electrically separated from a pixel trunk line 750_1.

For example, a first pixel branch line 710_1 of a first pixel PX1 may be electrically separated from the pixel trunk line 750_1. The first pixel branch line 710_1 may include a first branch separate line 710a_1 and a first branch spaced-apart portion 710b_1, and the first branch spaced-apart portion 710b_1 may be disposed between the first branch separate line 710a_1 and the pixel trunk line 750_1. The first branch separate line 710a_1 and the first branch spaced-apart portion 710b_1 may be aligned in the second direction D2 in which the first pixel branch line 710_1 extends.

The second branch separate line 720a_1 and the second branch spaced-apart portion 720b_1 may have the same (e.g., substantially the same) structure as above, and the third branch separate line 730a_1 and the third branch spaced-apart portion 730b_1 may have the same (e.g., substantially the same) structure as above. Redundant descriptions thereof will not be repeated here.

The branch separate lines 710a_1, 720a_1, and 730a_1 may be electrically separated from the pixel trunk line 750_1. In some embodiments, the branch separate lines 710a_1, 720a_1, and 730a_1 may come into electrical contact with different thin film transistors. The branch separate lines 710a_1, 720a_1, and 730a_1 may receive electrical signals different from those received by other branch separate lines 710a_1, the branch separate lines 710a_1, 720a_1, and 730a_1 and common branch lines 610_1, 620_1, and 630_1 may configure different pixels PX, and different luminous elements 350 disposed therebetween may be separately operated.

Next, referring to FIG. 12, in a display device 10_2 according to still another embodiment, pixel branch lines 710_2, 710_2, and 710_3 may include one or more of branch trunk lines 710a_2, 720a_2, and 730a_2.

For example, a first pixel branch line 710_2 of a first pixel PX1 may be electrically separated from a pixel trunk line 750_2. The first pixel branch line 710_2 may include a plurality of first branch separate lines 710a_2 and a first branch spaced-apart portion 710b_2. The first branch spaced-apart portion 710b_2 may be disposed between the first branch separate line 710a_2 and the pixel trunk line 750_2. The first branch spaced-apart portions 710b_2 may also be disposed between the first branch separate lines 710a_2. The plurality of first branch separate lines 710a_2 and the first branch spaced-apart portion 710b_2 may be aligned in the second direction D2 in which the first pixel branch line 710_2 extends.

Accordingly, the plurality of first branch separate lines 710a_2 and a first common branch line 610_2, which is disposed opposite to the plurality of first branch separate lines 710a_2 and spaced apart therefrom, may configure a single pixel PX. For example, unlike FIG. 11, a single first pixel branch line 710_2 may configure a plurality of pixels PX. The luminous elements 350 configured to emit the same (e.g., substantially the same) colored light are disposed between the first pixel branch line 710_2 and the first common branch line 610_2, but the luminous elements 350 may be separately operated by the plurality of first branch separate lines 710a_2.

The second branch separate line 720a_2 of the second pixel PX2 and the third branch separate line 730a_2 of the third pixel PX3 may also be identically described as above, and other structures are the same as those described above with reference to FIG. 11. Redundant descriptions thereof will not be repeated here.

Consequently, as illustrated in the drawings, a plurality of type pixels Flip 1 and Flip 2 may be arranged in the first direction D1 and the second direction D2. For example, the first type pixel Flip 1 may be arranged in the second direction D2 in the first pixel PX1 configured to display red (R). The second type pixel Flip 2 may be arranged in the second direction D2 in the second pixel PX2 which is adjacent to the first pixel PX1 in the first direction D1. Likewise, the first type pixel Flip 1 and the second type pixel Flip 2 each arranged in the second direction D2 may be arranged in the first pixel PX1 and the fourth pixel PX4 configured to display red (R). At a boundary between different type pixels Flip 1 and Flip 2, pixel branch lines or common branch lines, which are the same (e.g., substantially the same) type of branch lines, are disposed, and thus capacitance due to the AC power is not formed (or substantially not formed).

On the other hand, the same (e.g., substantially the same) type pixels Flip 1 and Flip 2 arranged in the second direction D2 may share some lines, e.g., common branch lines, in some cases. As illustrated in the drawings, pixel branch lines, which are different types of branch lines, may be electrically separated, and the same (e.g., substantially the same) type pixels Flip 1 and Flip 2 arranged in the second direction D2 may also be separately operated.

Ends of the pixel branch patterns 700P disposed to be adjacent to each other illustrated in FIG. 7, which are spaced apart from the common trunk line 650 and terminated, may be coupled to (e.g., connected to) each other. When an end of an arbitrary pixel branch pattern 700P is coupled to (e.g., connected to) another pixel branch pattern 700P which is spaced apart therefrom at a small gap, an average voltage drop of the AC power applied from the pixel trunk line 750 may be decreased. This will be described in more detail herein below with reference to FIGS. 13-15.

Figure 13:
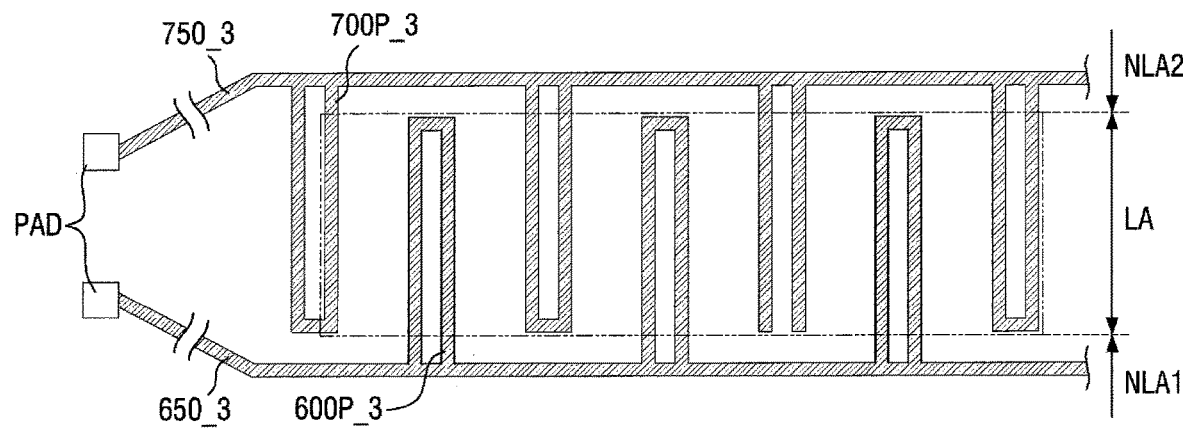
FIGS. 13-15 are cross-sectional views schematically illustrating a display device according to still another embodiment and a method of manufacturing the same.
Figure 14:
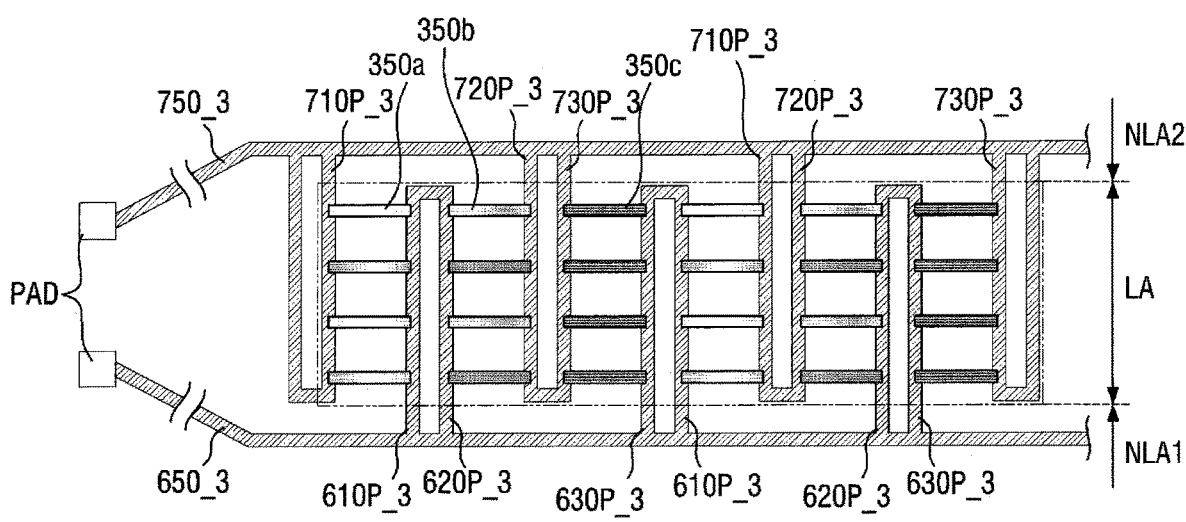
Figure 15:
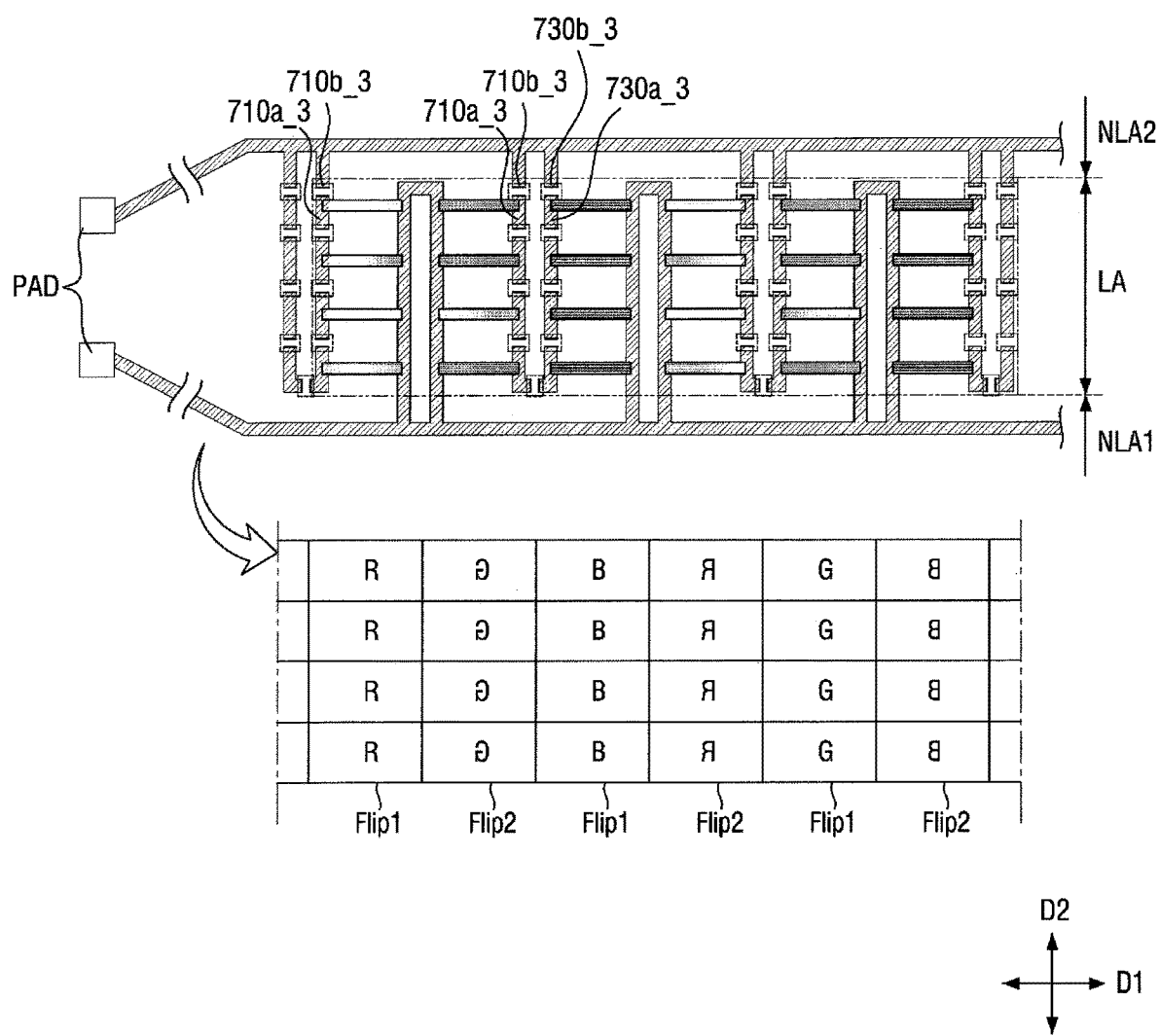

FIGS. 13-15 are cross-sectional views schematically illustrating a display device according to still another embodiment and a method of manufacturing the same.

Referring to FIGS. 13-15, during manufacture of a display device 10_3 according to still another embodiment (see FIG. 5), ends of at least some of arbitrary pixel branch patterns 700P_3 may be coupled to (e.g., connected to) each other at an anode-cathode layer ACL_3 formed at the insulating substrate layer 310. Ends of arbitrary common branch patterns 600P_3 may also be coupled to (e.g., connected to) each other.

For example, first, as illustrated in FIG. 14, two or more common branch patterns 600P_3 and two or more pixel branch patterns 700P_3 may form pairs and branch off. Ends of the patterns forming the pairs may be coupled to (e.g., connected to) each other.

The common branch pattern 600P_3 is spaced apart from a common trunk line 650_3 and branches off therefrom. The common branch pattern 600P_3 is spaced apart from a pixel trunk line 750_3 and terminated. Ends of common branch patterns 600P_3 which are opposite to the pixel trunk line 750_3 of patterns which branch off at a relatively small gap may be coupled to (e.g., connected to) each other.

The pixel branch pattern 700P_3 is spaced apart from the pixel trunk line 750_3 and branches off therefrom. The pixel branch pattern 700P_3 is spaced apart from the common trunk line 650_3 and terminated. Ends of pixel branch patterns 700P_3 which are opposite to the common trunk line 650_3 of patterns which branch off at a relatively small gap may be coupled to (e.g., connected to) each other.

The AC power applied through the pixel trunk line 750_3 may progressively weaken along the pixel branch pattern 700P_3. When ends of the pixel branch patterns 700P_3 which are opposite to the common trunk line 650_3 are coupled to (e.g., connected to) each other as illustrated in FIG. 13, the voltage drop of the AC power may be recovered at the coupled ends (e.g., connected ends). For example, the average voltage drop of the AC power formed in a direction in which the pixel branch pattern 700P_3 extends may be reduced. Accordingly, an AC power at a similar level as that applied to branch patterns disposed to be adjacent to the AC power may also be applied to branch patterns which are disposed at a relatively far distance from the AC power. Consequently, at a front surface of the display device 10_3, the luminous elements 350 may be uniformly (e.g., substantially uniformly) aligned.

Next, referring to FIG. 14, a plurality of luminous elements 350 are aligned in an area in which the common branch pattern 600P_3 and the pixel branch pattern 700P_3 are spaced apart from each other. The common branch pattern 600P_3 and the pixel branch pattern 700P_3 may align the luminous elements 350 and configure common branch lines 610_3, 620_3, and 630_3 and pixel branch lines 710_3, 720_3, and 730_3. Detailed descriptions thereof have been provided herein above with reference to FIG. 8.

Referring to FIG. 15, the pixel branch lines 710_3, 720_3, and 730_3 are patterned to form branch separate lines 710a_3, 720a_3, and 730a_3. In the case of FIG. 15, as in FIG. 12, the pixel branch lines 710_3, 720_3, and 730_3 may include the plurality of branch separate lines 710a_3, 720a_3, and 730a_3 and branch spaced-apart portions 710b_3, 720b_3, and 730b_3. The branch separate lines 710a_3, 720a_3, and 730a_3 may be disposed opposite to the common branch lines 610_3, 620_3, and 630_3, spaced apart therefrom, and configure a single pixel PX. More detailed descriptions thereof have been provided herein above with reference to FIG. 12, and thus, redundant description thereof will not be repeated here.

However, in the case of FIG. 15, ends of pixel branch patterns 600P_3 may be coupled to (e.g., connected to) each other. The coupled end (e.g., connected end) may be electrically separated, and the plurality of pixel branch lines 710_3, 720_3, and 730_3 may configure the branch separate lines 710a_3, 720a_3, and 730a_3, respectively. As illustrated in FIG. 15, a length of branch spaced-apart portions 710b_3', 720b_3', and 730b_3' disposed at the coupled ends (e.g., connected ends) may be shorter than a gap at which adjacent pixel branch lines, e.g., a second pixel branch line 720_3 and a third pixel branch line 730_3, are spaced apart. Accordingly, a portion of a second branch separate line 720a_3' and a portion of a third branch separate line 730a_3' disposed at the coupled ends (e.g., connected ends) may protrude in a direction in which the second branch separate line 720a_3' and the third branch separate line 730a_3' are disposed opposite to each other. However, embodiments are not limited thereto, and a length of the branch spaced-apart portions 710b_3', 720b_3', and 730b_3' disposed at the coupled ends (e.g., connected ends) may be equal to the gap at which the second pixel branch line 720_3 and the third pixel branch line 730_3 are spaced apart. In this case, the second branch separate line 720a_3' and the third branch separate line 730a_3' disposed at the coupled ends (e.g., connected ends) may substantially be aligned with another second branch separate line 720a_3 and another third branch separate line 730a_3 instead of protruding.

However, embodiments are not limited thereto. In the case of FIG. 15, although the pixel branch lines 710_3, 720_3, and 730_3 are illustrated as including the plurality of branch separate lines 710a_3, 720a_3, and 730a_3, the pixel trunk line 750_3 may include a trunk separate line as in the display device 10 of FIG. 1 in some cases. Also, as in the display device 10_1 of FIG. 11, each of the pixel branch lines 710_3, 720_3, and 730_3 may include only one branch separate line. The structure is not particularly limited as long as the ends of the pixel branch lines 710_3, 720_3, and 730_3 coupled to (e.g., connected to) each other are patterned and adjacent pixels PX are electrically separated. Since the descriptions of the structure have been provided herein above, redundant descriptions thereof will not be repeated here.

In a display device according to an embodiment, pixels having different line structures are disposed such that alignment signal lines of adjacent pixels can have a symmetrical structure (e.g., a substantially symmetrical structure). Accordingly, the drop of an alignment voltage can be prevented or reduced by removing capacitance that may be formed between the alignment signal lines of the adjacent pixels when power is applied. By preventing or reducing the drop of the alignment voltage during manufacture of the display device, luminous elements can be uniformly (e.g., substantially uniformly) aligned in the display device.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In concluding the detailed description, those skilled in the art will appreciate that many variations and modifications can be made to the disclosed embodiments without substantially departing from the principles of the present disclosure. Therefore, the described embodiments of the disclosure are used in a generic and descriptive sense only and not for purposes of limitation.

What is claimed is:

1. A display device comprising:
    first pixels, each of which comprises a first pixel branch line that extends in a first direction at one side portion of the first pixel and a first common branch line that extends in the first direction at another side portion that is opposite to the one side portion;
    second pixels, each of which comprises a second common branch line that extends in the first direction at one side portion of the second pixel and a second pixel branch line that extends in the first direction at another side portion of the second pixel that is opposite to the one side portion;
    a first luminous element between the first pixel branch line and the first common branch line; and
    a second luminous element between the second common branch line and the second pixel branch line,
    wherein the first pixel and the second pixel are arranged in a second direction which intersects the first direction.

2. The display device of claim 1, wherein at least one of the first pixels and at least one of the second pixels are alternately arranged in the second direction.

3. The display device of claim 2, wherein at least a portion of the first common branch line and a portion of the second common branch line are electrically coupled.

4. The display device of claim 3, wherein the second common branch line is spaced apart from the second pixel branch line along the second direction,
    the display device further comprising a third pixel branch line spaced apart from the second pixel branch line along the first direction.

5. The display device of claim 4, wherein at least a portion of the second pixel branch line and a portion of the third pixel branch line protrude in a direction in which the second pixel branch line and the third pixel branch line face each other at one end in the first direction.

6. The display device of claim 5, wherein at least one of the second pixels comprises the first luminous element.

7. The display device of claim 1, wherein at least one of the first pixels is arranged in the first direction.

8. The display device of claim 7, wherein the first common branch lines of the first pixels arranged in the first direction extend in the first direction and are coupled.

9. The display device of claim 8, further comprising a common trunk line that extends in the second direction,
    wherein the first common branch lines that extend in the first direction are coupled to the common trunk line.

10. The display device of claim 7, wherein the first pixel branch lines of the first pixels arranged in the first direction are spaced apart from each other and are aligned in the first direction.

11. A display device comprising:
    a pixel array comprising alternately arranged first pixels and second pixels, the pixel array extending in a first direction, wherein:
    each of the first pixels and the second pixels comprises a pixel electrode, a common electrode opposite to the pixel electrode, and a luminous element disposed on the pixel electrode and the common electrode;
    a first end portion of the luminous element is disposed on the pixel electrode and a second end portion of the luminous element is disposed on the common electrode;
    in the first pixels, the pixel electrode is at one side of the common electrode in the first direction; and
    in the second pixels, the pixel electrode is at the other side of the common electrode in the first direction.

12. The display device of claim 11, wherein the pixel electrode and the common electrode of the first pixel and the second pixel, respectively, comprise a portion that extends in a second direction that intersects the first direction.

13. The display device of claim 12, further comprising a common trunk line that extends in the first direction, wherein:
    the common electrode of the first pixels comprises a first common branch pattern;
    the common electrode of the second pixels adjacent to the first pixels comprises a second common branch pattern opposite to the first common branch pattern and separated therefrom; and
    the first common branch pattern and the second common branch pattern are coupled to the common trunk line.

14. The display device of claim 13, wherein an end of the first common branch pattern and an end of the second common branch pattern are coupled to each other.

15. A method of manufacturing a display device, the method comprising:
    forming, on a substrate, a conductive layer comprising a first pixel line extending in a first direction, a second pixel line at one side portion of the first pixel line in a second direction that intersects the first direction, and a first common line at the other side portion of the first pixel line in an opposite direction of the one side portion;
    aligning a luminous element between the first pixel line and the first common line; and
    forming a separate line by patterning at least a portion of the first pixel line extending in the first direction.

16. The method of claim 15, wherein:
    the conductive layer further comprises a second common line of the second pixel line at an opposite direction of a direction in which the first pixel line is disposed; and
    the second pixel line and the second common line are spaced apart from each other.

17. The method of claim 16, wherein, in the forming of the conductive layer, at least a portion of the first pixel line and a portion of the second pixel line are coupled to each other.

18. The method of claim 17, wherein the forming of the separate line comprises patterning an area in which the first pixel line and the second pixel line are coupled and electrically separating the first pixel line and the second pixel line.

19. The method of claim 17, wherein:
    the conductive layer further comprises a common trunk line that extends in the second direction; and
    the first common line and the second common line extend in the first direction and are coupled to the common trunk line.

20. The method of claim 19, wherein the aligning of the luminous element comprises:
    grounding one end of the common trunk line and applying alignment power to the first pixel line and the second pixel line; and forming capacitance between the first pixel line and the first common branch line.

* * * * *